(12) United States Patent
Chao et al.

(10) Patent No.: US 12,224,209 B2
(45) Date of Patent: Feb. 11, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Chia-Cheng Chao, Hsinchu (TW); Hsin-Chieh Huang, Taoyuan (TW); Yu-Wen Wang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 391 days.

(21) Appl. No.: 17/715,967

(22) Filed: Apr. 8, 2022

(65) Prior Publication Data

US 2023/0326798 A1 Oct. 12, 2023

(51) Int. Cl.
*H01L 21/8234* (2006.01)
*H01L 21/306* (2006.01)
*H01L 29/06* (2006.01)
*H01L 29/423* (2006.01)

(52) U.S. Cl.
CPC ........ *H01L 21/823412* (2013.01); *H01L 21/30604* (2013.01); *H01L 21/823437* (2013.01); *H01L 21/823481* (2013.01); *H01L 29/0665* (2013.01); *H01L 29/42392* (2013.01)

(58) Field of Classification Search
None
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,796,666 | B1 | 8/2014 | Huang et al. |
| 8,815,712 | B2 | 8/2014 | Wan et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 8,963,258 | B2 | 2/2015 | Yu et al. |
| 9,093,530 | B2 | 7/2015 | Huang et al. |
| 9,105,490 | B2 | 8/2015 | Wang et al. |
| 9,171,929 | B2 | 10/2015 | Lee et al. |
| 9,209,247 | B2 | 12/2015 | Colinge et al. |
| 9,214,555 | B2 | 12/2015 | Oxland et al. |
| 9,236,267 | B2 | 1/2016 | De et al. |
| 9,236,300 | B2 | 1/2016 | Liaw |
| 9,412,817 | B2 | 8/2016 | Yang et al. |

(Continued)

*Primary Examiner* — Hsien Ming Lee
(74) *Attorney, Agent, or Firm* — JCIPRNET

(57) ABSTRACT

A manufacturing method of a semiconductor device includes forming a stack of first semiconductor layers and second semiconductor layers alternatively formed on top of one another, where a topmost layer of the stack is one of the second semiconductor layers; forming a patterned mask layer on the topmost layer of the stack; forming a trench in the stack based on the patterned mask layer to form a fin structure; forming a cladding layer extending along sidewalls of the fin structure; and removing the patterned mask layer and a portion of the cladding layer by performing a two-step etching process, where the portion of the cladding layer is removed to form cladding spacers having a concave top surface with a recess depth increasing from the sidewalls of the fin structure.

20 Claims, 32 Drawing Sheets

(56) References Cited

U.S. PATENT DOCUMENTS

| | | |
|---|---|---|
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,548,303 B2 | 1/2017 | Lee et al. |
| 9,576,814 B2 | 2/2017 | Wu et al. |
| 9,608,116 B2 | 3/2017 | Ching et al. |
| 2005/0285988 A1* | 12/2005 | Nakagawa ........ G02F 1/136213 349/44 |
| 2022/0406920 A1* | 12/2022 | Chao ................. H01L 29/775 |

* cited by examiner

SEMICONDUCTOR DEVICE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. However, such scaling has also introduced increased complexity to the semiconductor manufacturing process. Thus, the realization of continued advances in ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-6A, 6C, 7-12A, 13A, 14A, 15-16A, and 17A are perspective views schematically illustrating various stages of a manufacturing method of a semiconductor device, in accordance with some embodiments.

DETAILED DESCRIPTION

Figure 1:
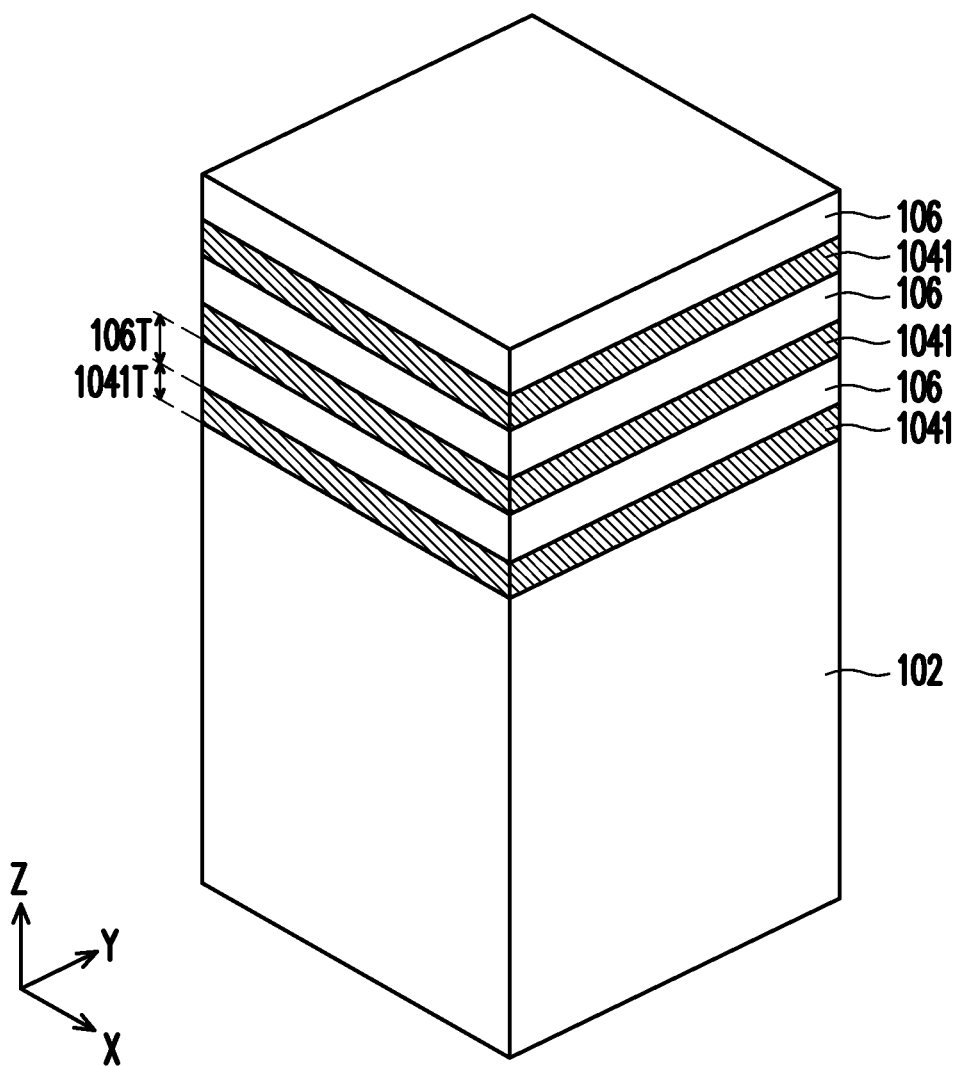

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the disclosure describe a manufacturing process of a semiconductor device (or a portion of a nanostructure transistor device). The nanostructure transistor device (also referred to as a gate-all-around (GAA) transistor device) may include a gate structure wrapping around the perimeter of one or more nanostructures (i.e. channel regions) for improved control of channel current flow. In some embodiments, the semiconductor device is formed on bulk silicon substrates. Still, the semiconductor device may be formed on a silicon-on-insulator (SOI) substrate, a germanium-on-insulator (GOI) substrate, a silicon germanium substrate, or a Group III-V semiconductor substrate. Also, in accordance with some embodiments, the silicon substrate may include other conductive layers or other semiconductor elements, such as transistors, diodes or the like. The embodiments are not limited in this context. The semiconductor device may be included in microprocessors, memories, and/or other integrated circuits (IC). Accordingly, it is understood that additional processes may be provided before, during, and after the illustrated method, and that some other processes may only be briefly described herein. Also, the structures illustrated in the drawings are simplified for a better understanding of the concepts of the present disclosure. For example, although the figures illustrate the structure of the semiconductor device, it is understood the semiconductor device may be part of an IC that further includes a number of other devices such as resistors, capacitors, inductors, fuses, etc.

FIGS. 1-6A, 6C, 7-12A, 13A, 14A, 15-16A, and 17A are perspective views schematically illustrating various stages of a manufacturing method of a semiconductor device, FIGS. 6B, 6D, 14B, 16B, and 17B are cross-sectional views of the semiconductor device along the Y-direction, where FIGS. 6B, 6D, 14B, 16B, and 17B correspond to FIGS. 6A, 6C, 14A, 16A, and 17A, respectively, in accordance with some embodiments. FIGS. 12B and 13B are cross-sectional views of the semiconductor device respectively taken along a line 12B-12B in FIG. 12A and a line 13B-13B in FIG. 13A, in accordance with some embodiments. FIGS. 14C-14D, 16C-16D, and 17C-17E are cross-sectional views of the semiconductor device along the X-direction, where FIGS. 14C-14D, 16C-16D, and 17C-17E correspond to FIGS. 14A, 16A, and 17A, respectively, in accordance with some embodiments. For clarity of illustrations, in the drawings are illustrated the orthogonal axes (X, Y and Z) of the Cartesian coordinate system according to which the views are oriented.

Referring to FIG. 1, a stack of first and second semiconductor layers (104l and 106) may be formed on a semiconductor substrate 102. In some embodiments, the semiconductor substrate 102 includes a crystalline silicon substrate or a bulk silicon substrate (e.g., wafer). In some embodiments, the semiconductor substrate 102 is made of a suitable elemental semiconductor (e.g., germanium), a suitable compound semiconductor (e.g., gallium arsenide, silicon carbide, indium arsenide, or indium phosphide), a suitable alloy semiconductor (e.g., silicon germanium carbide, gallium arsenic phosphide, or gallium indium phosphide), and/or the like. In some embodiments, the semiconductor substrate 102 includes a SOI substrate. The semiconductor substrate 102 may include various doped regions (not individually shown) doped with p-type or n-type dopants, where the doped regions may be configured for an n-type FET, or alternatively, configured for a p-type FET.

The first semiconductor layers 104I and the second semiconductor layers 106 may be alternately stacked upon one another (e.g., along the Z direction) to form a stack. The first semiconductor layers 104I may be considered sacrificial layers in the sense that they are removed in the subsequent process. In some embodiments, the bottommost one of the first semiconductor layers 104I is formed on the semiconductor substrate 102, with the remaining second and first semiconductor layers (106 and 102) alternately stacked on top. However, either the first semiconductor layer 104I or the second semiconductor layer 106 may be the bottommost layer (or the layer most proximate from the semiconductor substrate 102), and either the first semiconductor layer 104I or the second semiconductor layer 106 may be the topmost layer (or the layer most distanced to the semiconductor substrate 102). The disclosure is not limited by the number of stacked semiconductor layers. In some embodiments, the thickness 104IT of the respective first semiconductor layer 104I measured along the Z-direction is in a range of about 4 nm to about 12 nm. The thickness 106T of the respective second semiconductor layer 106 measured along the Z-direction may be in a range of about 6 nm to about 15 nm. Although other values of the thicknesses (106T and 104IT) are possible depending on product and process requirements.

The first semiconductor layers 104I and the second semiconductor layers 106 may have different materials (or compositions) that may provide for different oxidation rates and/or different etch selectivity between the layers. For example, the second semiconductor layers 106 are formed of the same material as the semiconductor substrate 102, while the first semiconductor layers 304 may be formed of a different material which may be selectively removed with respect to the material of the semiconductor substrate 102 and the second semiconductor layers 106. In some embodiments, the material of the first semiconductor layers 104I includes silicon germanium (SiGe). For example, germanium (Ge) may include about 15% to 35% of the first semiconductor layers 104I of SiGe in molar ratio. In some embodiments, the second semiconductor layers 106 include silicon (Si), where each of the second semiconductor layers 106 may be undoped or substantially dopant-free. The second semiconductor layers 106 may be considered as semiconductor channel layers. However, the disclosure is not limited thereto, and other suitable material, or other combinations of materials for which selective etching is possible are contemplated within the scope of the disclosure.

Figure 2:
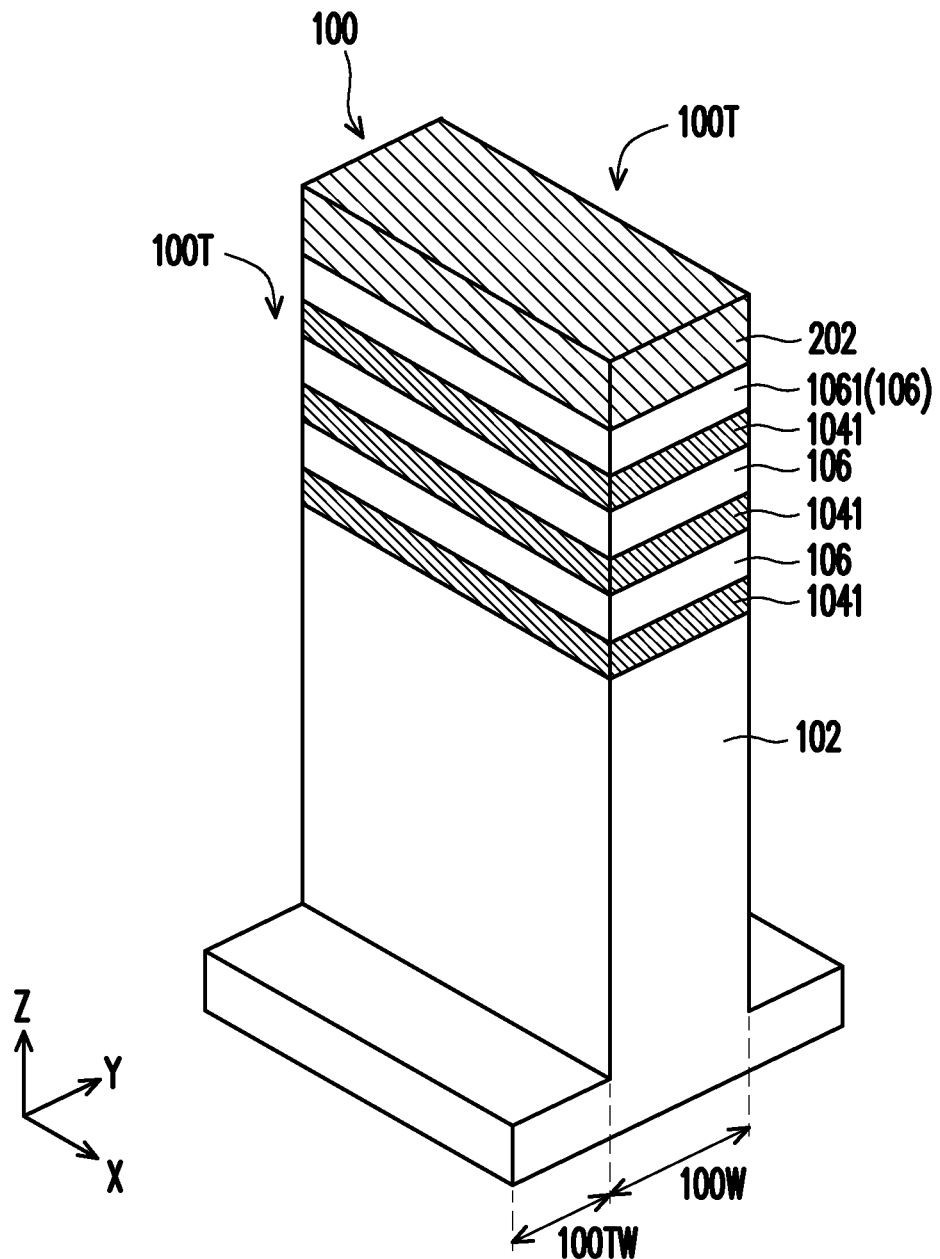

Referring to FIG. 2 and with reference to FIG. 1, a portion of the stack of first and second semiconductor layers (104I and 106) and a portion of the semiconductor substrate 102 may be removed to form first trenches (or openings) 100T, thereby defining a fin structure 100 between adjacent first trenches 100T. The first trenches 100T may continuously extend along the X-direction. For example, the critical dimension 100TW (or the width measured along the Y-direction) of the respective first trench 100T is in a range of about 25 nm to about 80 nm. The critical dimension 100W (or the width measured along the Y-direction) of the fin structure 100 may be in a range of about 5 nm to about 40 nm, depending on the N-type fin or the P-type fin. For example, the critical dimension of the N-type fin may be in a range of about 20 nm to about 40 nm, and the critical dimension of the P-type fin may be in a range of about 5 nm to about 20 nm. Although other values of the critical dimensions are possible depending on various device regions. It should be noted that while a single fin structure 100 is illustrated in FIG. 2, the disclosure is not limited by the numbers of fin structures 100, which may be adjusted according to the requirements of the circuit design. When multiple fin structures 100 are formed, the first trenches 100T may be disposed between any adjacent ones of the fin structures 100.

The fin structure 100 may be formed by patterning the stack of first and second semiconductor layers (104I and 106) and the semiconductor substrate 102 using, e.g., lithography and etching techniques. For example, a layer of mask material is formed over the topmost one of the second semiconductor layers 106 (also called the top semiconductor layer 106I herein). The mask layer may be a single layer or include more than one sublayer. In some embodiments where the mask layer includes sublayers, each of the sublayers is formed of a semiconductor material similar to the material of first and second semiconductor layer 104I or 106 or is formed of different dielectric materials. The mask layer may be patterned using, e.g., lithography techniques to form a patterned mask layer 202 (also referred to as a hard mask). The patterned mask layer 202 may have an elongated size along the X-direction with respect to the Y-direction. The patterned mask layer 202 may be subsequently used to pattern exposed portions of the stack of first and second semiconductor layers (104I and 106) and the semiconductor substrate 102. The patterned mask layer 202 is optionally removed after forming the fin structure 100 or may be removed during the subsequently-performed etching process. The fin structure 100 may be formed by etching trenches in the stack of first and second semiconductor layers (104I and 106) and the semiconductor substrate 102. In some embodiments, the first trenches 100T may be parallel strips (when viewed from the top) elongated along the X-direction and distributed along the Y-direction.

Figure 3:
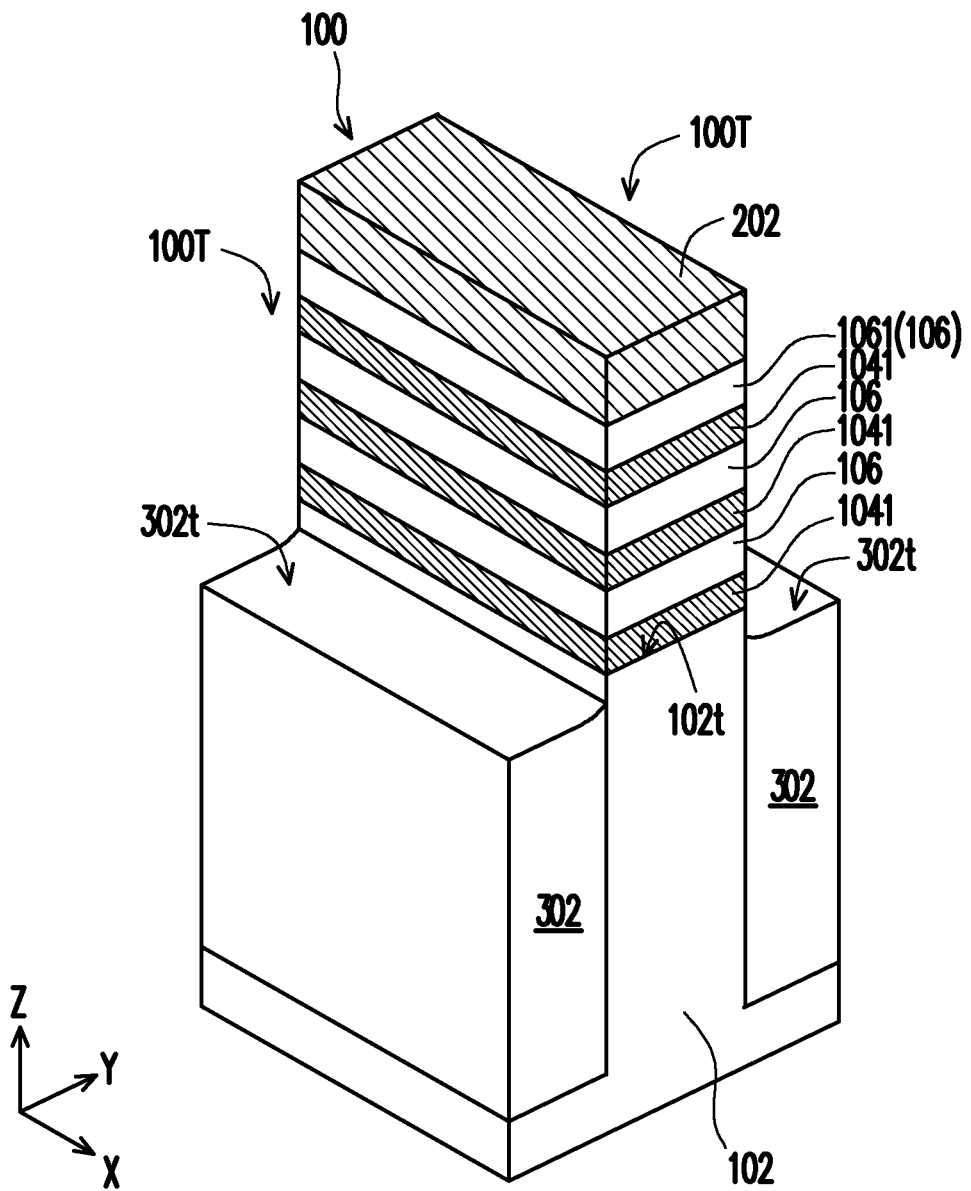

Referring to FIG. 3, a plurality of isolation structures 302 (sometimes referred to as shallow trench isolation (STI) structures) may be formed in lower portions of the first trenches 100T. For example, the isolation structures 302 extend at opposing sides of a lower portion of the semiconductor substrate 102. In some embodiments where multiple fin structures 100 are provided, each of the isolation structures 302 is disposed between adjacent ones of the fin structures 100 and covers respective a sidewall of a lower portion of the respective fin structure 100. The isolation structures 302 may be formed of an insulation material (e.g., an oxide, a Si-based oxide (e.g., SiOC, SiOCN, or the like), a nitride, the like, any other suitable material, or combinations thereof) which may electrically isolate neighboring fin structures 100 from each other.

In some embodiments, the isolation structures 302 are formed by initially depositing a layer of insulation material in the respective first trench 100T and recessing the layer of insulation material using an acceptable etching process, such as one that is selective to the material of the isolation structures 302. For example, a dry etching process is performed to form the isolation structures 302 having a relatively smooth top surfaces 302t. In alternative embodiments, a wet etching process is used. The isolation structures 302 may be recessed to where top surfaces 302t of the isolation structures 302 are below the top surface 102t of the semiconductor substrate 102, and thus the fin structure 100 protrudes from the neighboring isolation structures 302. The top surfaces 302t of the isolation structures 302 may be a flat surface, a curved (e.g., convex or concave) surface, or combinations thereof, depending on the etching process.

Figure 4:
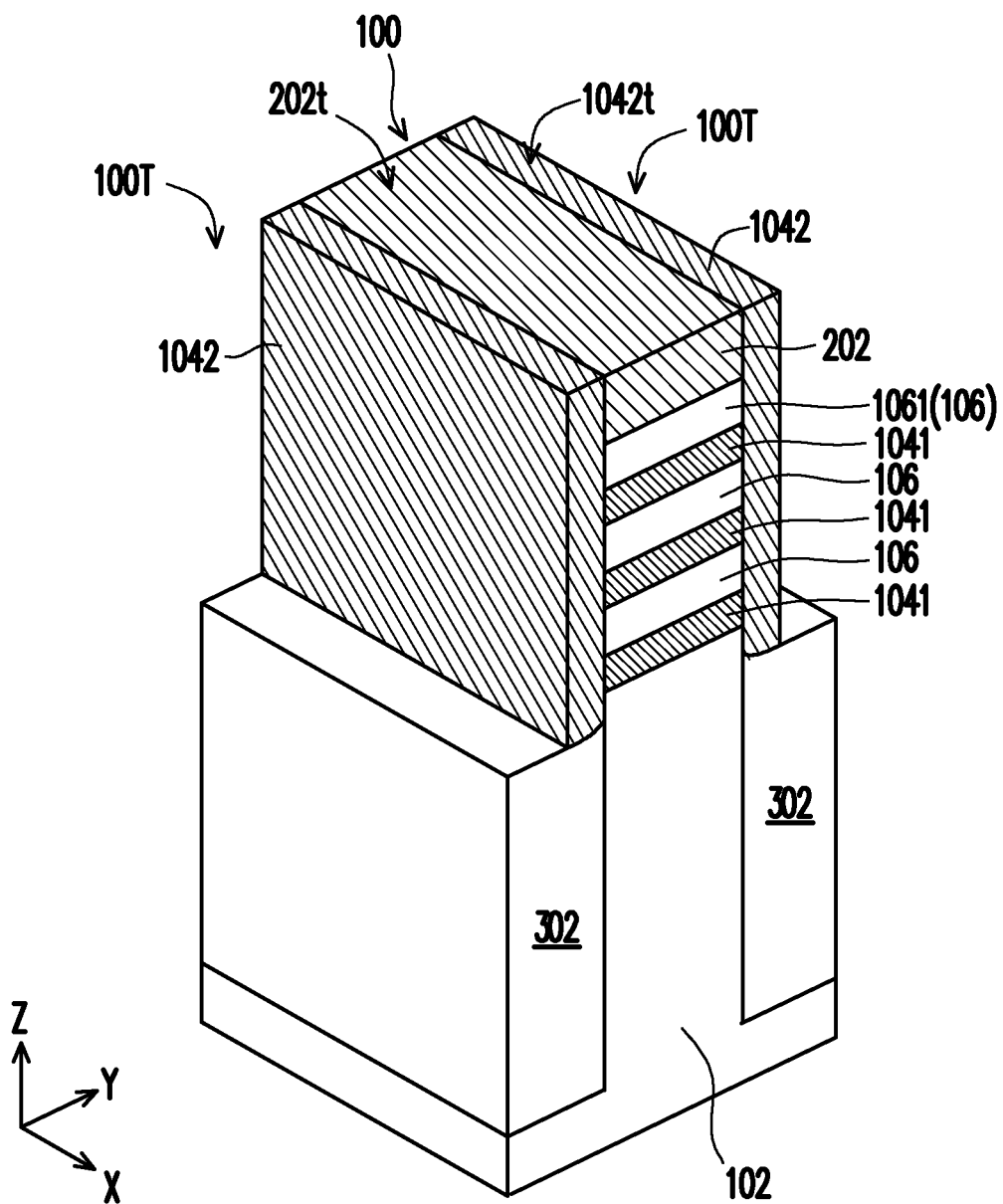

Referring to FIG. 4, a cladding layer 1042 may extend along at least opposing sidewalls of the fin structure 100. In some embodiments where the patterned mask layer 202 is still remained on the top semiconductor layer 1061, a layer of cladding material is first conformally formed to cover the sidewalls of the fin structure 100 and the top surface of the patterned mask layer 202, and then the upper portion of the layer of cladding material may be removed (or planarized) using any suitable planarization process to form the cladding layer 1042. In some embodiments, the top surface 1042t of the cladding layer 1042 is substantially leveled (or coplanar) with the top surface 202t of the patterned mask layer 202. For example, the cladding layer 1042 is epitaxially grown from the fin structure 100, a main portion of the cladding layer 1042 is formed around the fin structure 100, with a slight portion of the cladding layer 1042 formed to overlay the isolation structures 302. In some embodiments, the cladding layer 1042 includes the same material as the first semiconductor layers 1041 (e.g., SiGe or the like). Both of the cladding layer 1042 and the first semiconductor layers 1041 may be considered as the sacrificial layers. The cladding layer 1042 and the patterned mask layer 202 may be formed of the same (or similar) material (e.g., SiGe or the like). For example, the patterned mask layer 202 has a first percentage of Ge and the cladding layer 1042 may have a second percentage of Ge, where the first percentage is higher than the second percentage. In alternative embodiments where the second semiconductor layers 106 acts as sacrificial layers, the cladding layer 1042 includes the same material as the second semiconductor layers 106.

Figure 5:
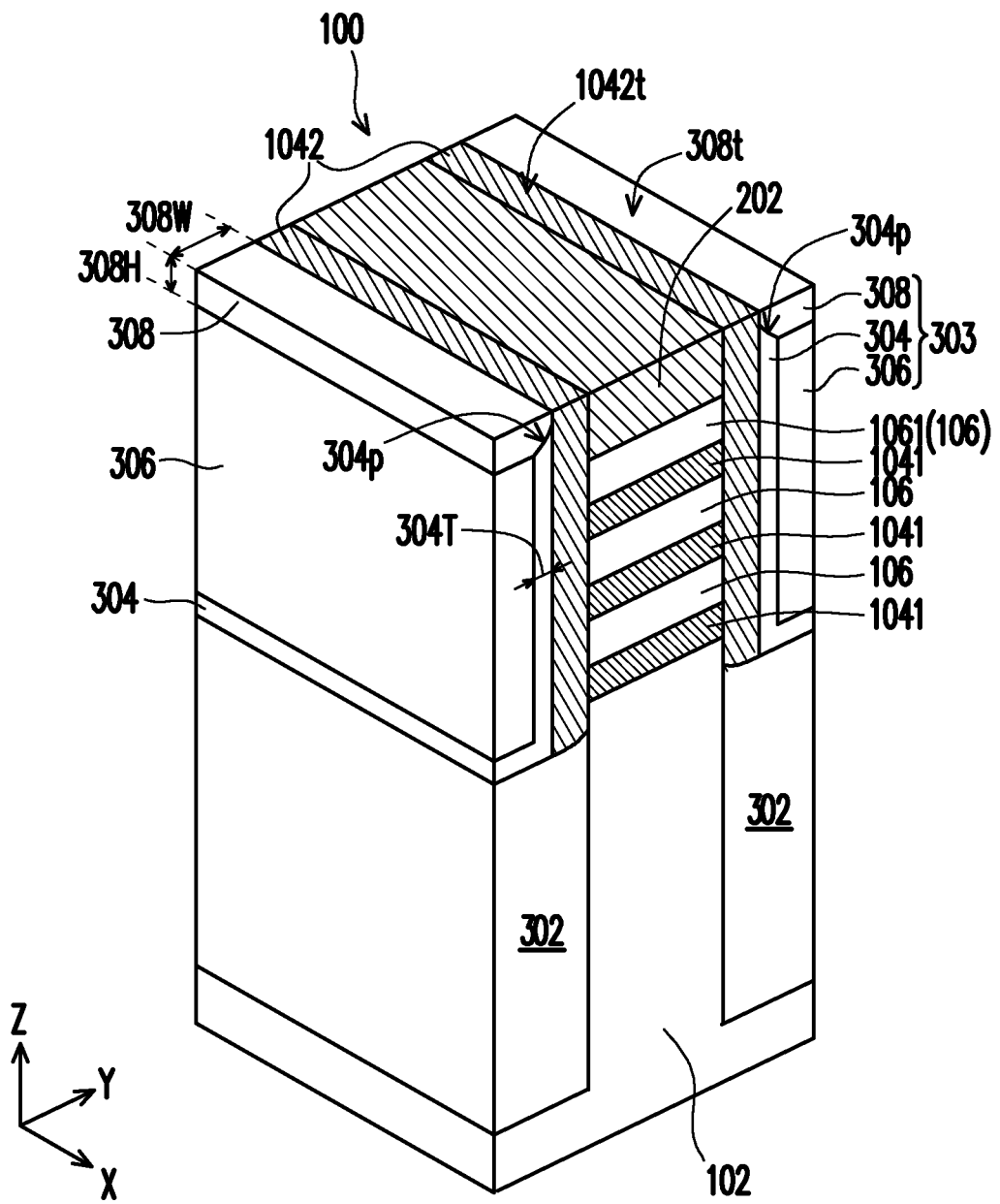

Referring to FIG. 5 and with reference to FIG. 4, a plurality of dielectric structures 303 may be formed on the isolation structures 302 to fill the first trenches 100T. The respective dielectric structure 303 may include a plurality of dielectric layers (e.g., a first dielectric layer 304, a second dielectric layer 306, and a third dielectric layer 308). For example, a material of the first dielectric layer 304 may be initially formed in the respective first trench 100T in a conformal manner to overlay the sidewalls of the cladding layer 1042 and the top surface of the isolation structure 302. In some embodiments, the thickness 304T of the first dielectric layer 304 formed on the cladding layer 1042 and measured along the Y-direction is in a range of about 2 nm to about 8 nm. Although other values of the thickness may be possible. Next, a material of the second dielectric layer 306 may be formed on the first dielectric layer 303 to fill the respective first trench 100T, and then the material of the second dielectric layer 306 may be recessed using any suitable etching process, such as one that is selective to the material of the second dielectric layer 306. The material of the first dielectric layer 304 may be etched as having one or more tilted portions. Subsequently, the third dielectric layer 308 may be formed on the recessed top surfaces of the first dielectric layer 304 and the second dielectric layer 306 to fill the entirety of the respective first trench 100T and extend along the X-direction. In some embodiments, a planarization process (e.g., chemical mechanical polishing (CMP) process, an etching process, and/or other suitable processes) is applied so that a top surface 308t of the third dielectric layer 308 is substantially leveled (or coplanar) with a top surface 1042t of the cladding layer 1042, within process variations.

For example, the first dielectric layer 304 and/or the second dielectric layer 306 include any suitable dielectric material such as an oxide, a Si-based oxide (e.g., SiOC, SiOCN), or the like), a nitride, or a combination thereof. In some embodiments, the first dielectric layer 304 and the second dielectric layer 306 are of different materials. For example, the first dielectric layer 304 is a nitride-based dielectric layer, and the second dielectric layer 306 is an oxide-based dielectric layer. The third dielectric layer 308 may include any suitable dielectric material such as a metal oxide, a Si-based oxide, a core-shell structure, and/or the like. In some embodiments, the third dielectric layer 308 is referred to as a high-k dielectric layer. The lateral dimension 308W (e.g., the width measured along the Y-direction) of the third dielectric layer 308 may be in a range of about 15 nm to about 200 nm. The maximum height 308H of the third dielectric layer 308 measured along the Z-direction may be in a range of about 15 nm to about 40 nm. Although other values of the width and height of the third dielectric layer 308 are possible depending on product and process requirements.

Figure 6A:
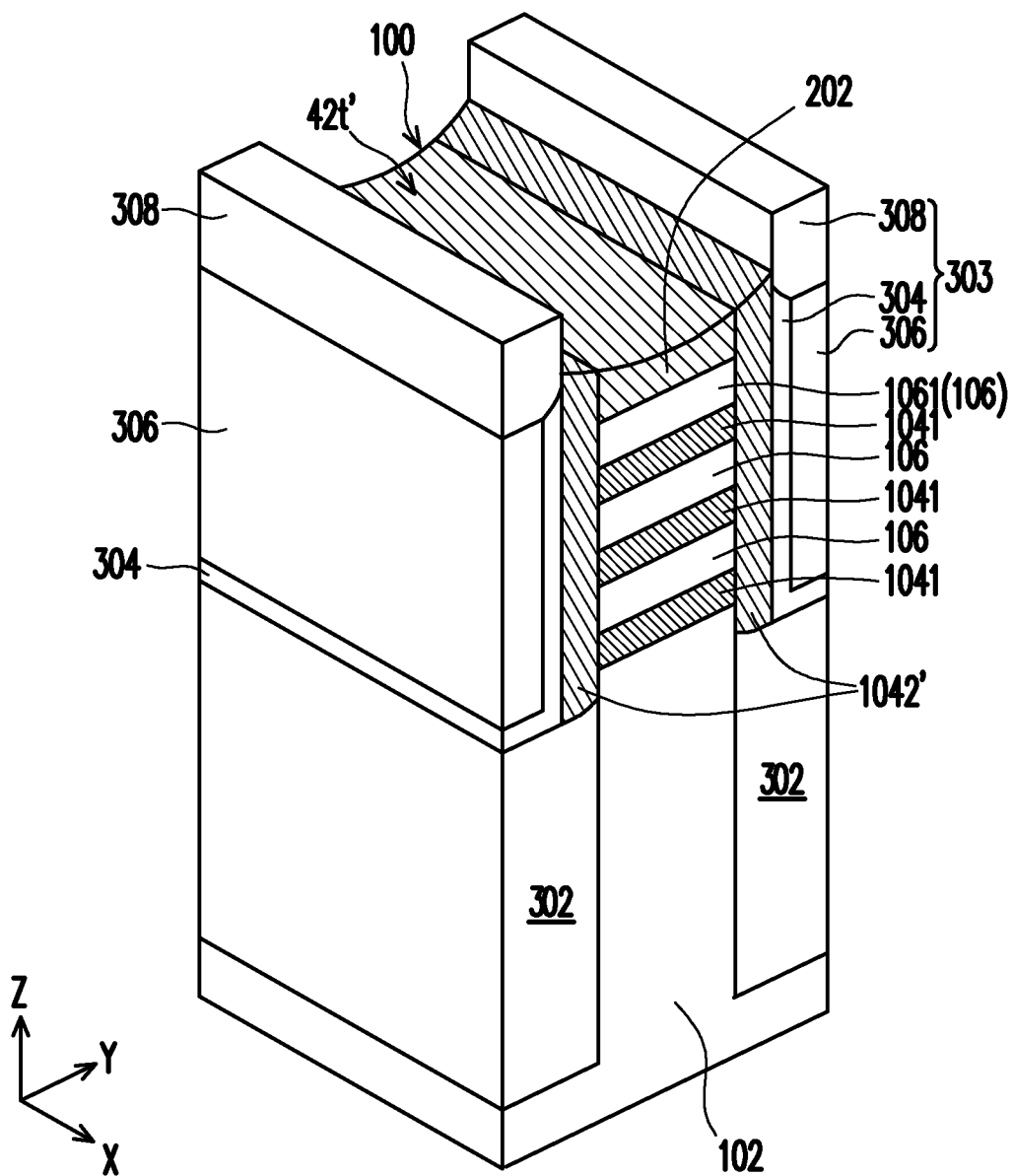
Figure 6B:
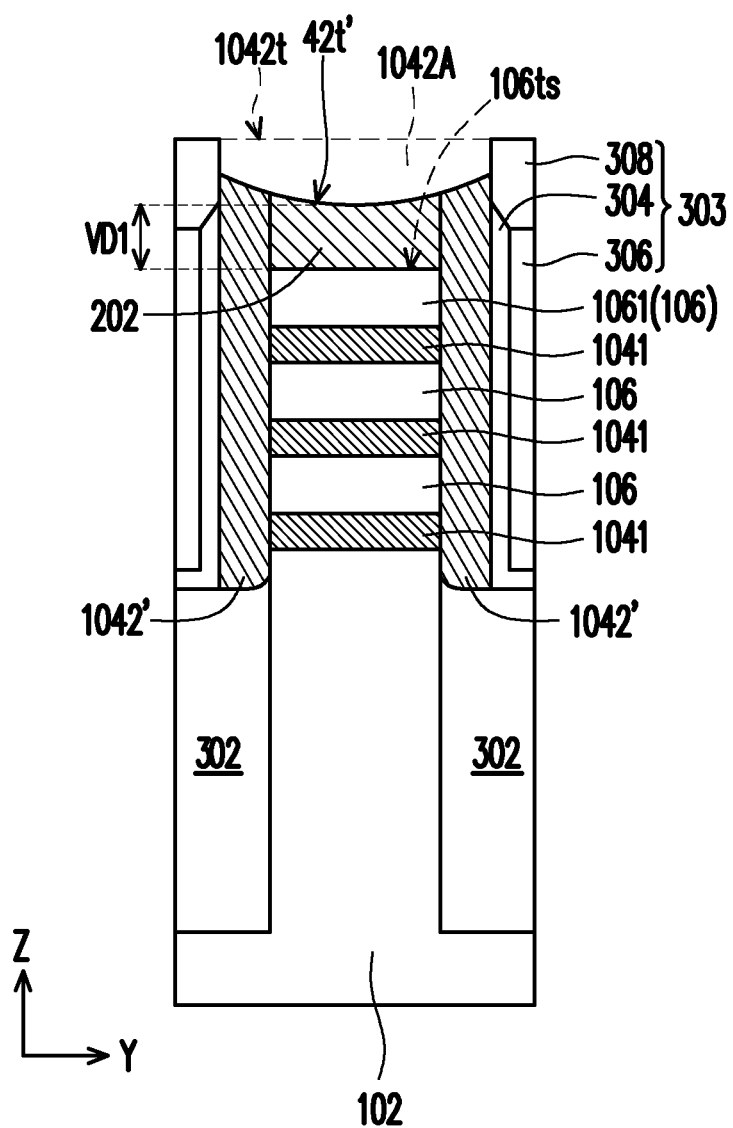
FIGS. 6B, 6D, 14B, 16B, and 17B are cross-sectional views of the semiconductor device along the Y-direction, where FIGS. 6B, 6D, 14B, 16B, and 17B correspond to FIGS. 6A, 6C, 14A, 16A, and 17A, respectively, in accordance with some embodiments.
Figure 6C:
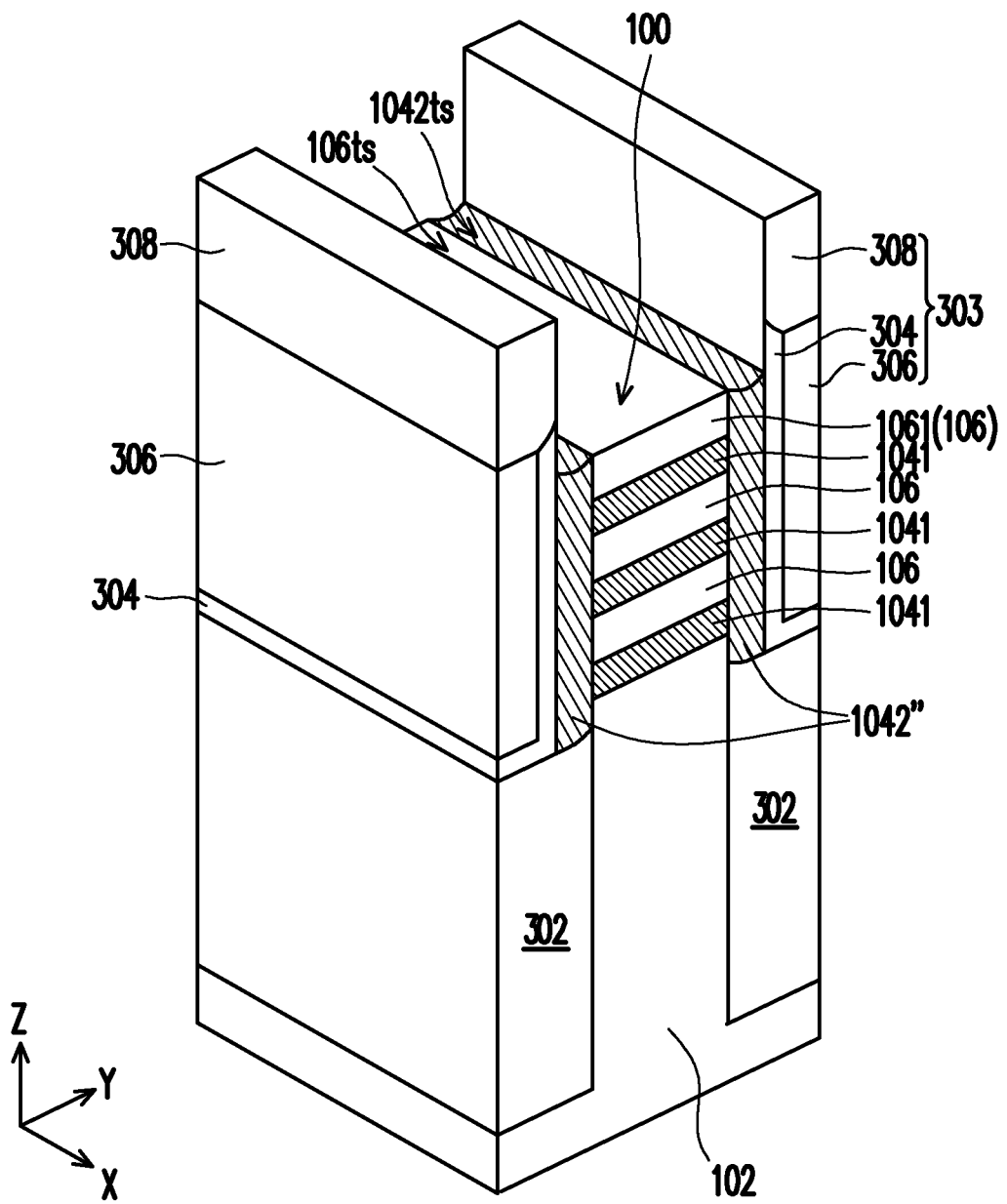
Figure 6D:
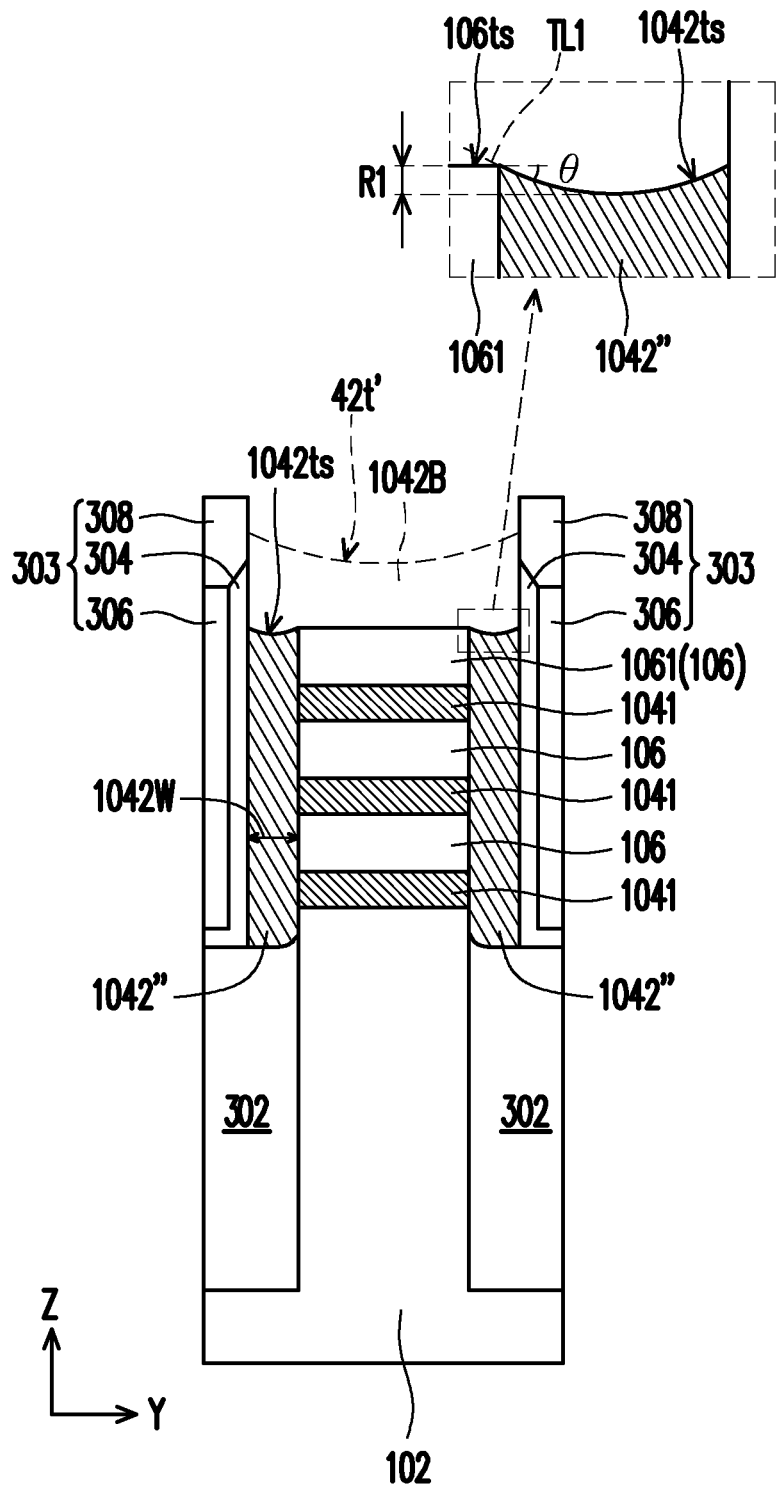

Referring to FIGS. 6A-6D, an etching process may be performed on the cladding layer 1042 (and the patterned mask layer 202, if still present) until the top semiconductor layer 1061 is accessibly exposed as shown in FIGS. 6C-6D. In some embodiments, a fully wet etching process is used. For example, the etching process is a two-step etching process in which a first top portion 1042A of the cladding layer 1042 (and the patterned mask layer 202, if still present) may be etched away in a first etching step (as shown in FIGS. 6A-6B) and then a second top portion 1042B of the cladding layer 1042 (and the patterned mask layer 202, if still present) is etched away in a second etching step which stops at the second semiconductor layers 106 (as shown in FIGS. 6C-6D). The two-step etching process may enable a precise control of the etching process and the quality and yield of the resulting fin structure may be improved. For example, a relatively flat top surface of the top semiconductor layer 1061 is obtained.

With reference to FIGS. 6A-6B, a first etching step (e.g., a first wet etch process) may be carried out by a first etchant which may have a low selectivity to the cladding layer 1042 (and the patterned mask layer 202, if still present) to partially remove the cladding layer 1042 (and the patterned mask layer 202, if still present). For example, the first top portion 1042A is removed and the etching stops at the top surface 42t'. The first etchant may have the lower selectivity toward the material of the cladding layer 1042 (and the patterned mask layer 202) so as to achieve a higher etch rate for the material of the cladding layer 1042 (and the patterned mask layer 202), and thus the cladding layer 1042 (and the patterned mask layer 202, if still present) is removed quickly when exposed to the first etchant. In some embodiments where the cladding layer 1042 and the patterned mask layer 202 are formed of SiGe, the first etchant is a chemical etchant (i.e., etchant solution) that is capable of removing SiGe via a redox reaction followed by dissolution of the oxide by an acid. For example, the first etching step includes exposure to the FOM solution ($HF+O_3$), since the FOM solution is effective in removing SiGe through the oxidation by $O_3$ and dissolution of the oxide by HF. It is understood that other etching chemicals may be used for partially removing the cladding layer 1042 (and the patterned mask layer 202, if still present) in the first etching step. The first etching step is then terminated after a period of time (e.g., the etcher is operated in a time mode).

As shown in FIG. 6B, the first top portion 1042A is etched away and the remaining portion of the cladding layer 1042' (and the patterned mask layer 202, if still present) has the top surface 42t' over the top semiconductor layer 1061. Since the patterned mask layer 202 and the cladding layer 1042 may have different percentage of Ge, the etch rate of the first etchant between the patterned mask layer 202 and the cladding layer 1042 may be different, so that the top surface 42t' may not be flat. For example, the top surface 42t' is a concave surface (e.g., dishing surface or smiling surface). In some embodiments, the percentage of Ge in the patterned mask layer 202 is higher than that of in the cladding layer 1042, and more of the patterned mask layer 202 may be removed in comparison to the cladding layer 1042 due to the higher Si content of the cladding layer 1042. The lowest point (or the center point) of the top surface 42t' may be right above the top surface 106ts of the top semiconductor layer 1061. For example, the vertical distance VD1 measured from the lowest point of the top surface 42t' to the top surface 106ts of the top semiconductor layer 1061 is non-zero. The highest point (or the edge point) of the top surface 42t' may intersect the sidewall of the third dielectric layer 308 of the neighboring dielectric structure 303. It should be noted that the illustration of the top surface 42t' in FIG. 6B is merely an example, the curvature of the top surface 42t' may vary depending on the percentage of Ge in the cladding layer (and the patterned mask layer 202, if still present).

With reference to FIGS. 6C and 6D, the second etching step (e.g., a second wet etch process) may be carried out by a second etchant which may have a higher selectivity to the material of the second semiconductor layers 106 and a lower selectivity to the material of the cladding layer 1042' (and the patterned mask layer 202, if still present). The second etchant may be used to etch away the remaining portion of the cladding layer 1042' (and the patterned mask layer 202, if still present) over the top semiconductor layer 1061 and stop at the top semiconductor layer 1061 and the top surface 1042ts of the cladding spacers 1042". The second etchant may be used to remove the second top portion 1042B with high selectivity toward the top semiconductor layer 1061. In some embodiments where the cladding layer 1042' (and the patterned mask layer 202, if still present) may be formed of SiGe and the top semiconductor layer 1061 may be formed of Si, the second etching step is conducted utilizing the second etchant which is a chemical etchant (i.e., etchant solution) capable of removing SiGe without substantially damaging Si.

In some embodiments, the second etching step includes exposure to an alkaline solution (e.g., Standard Clean-1 (SC-1; $NH_4OH+H_2O_2$) solution). The second etchant may provide a target etching selectivity between the cladding layer 1042' and the second semiconductor layers 106. For example, the SC-1 solution has an etch selectivity ratio for SiGe/Si about 4. Any other suitable etch chemistry may be used in the second etching step. In some embodiments, the temperature of the second etchant is set to a relatively higher temperature. For example, the second etchant solution is heated to the desired temperature higher than room temperature before processing. In some embodiments where the SC-1 solution is used in the second etching step, the cladding layer 1042' (and the patterned mask layer 202, if still present) may be etched by applying the SC-1 at a temperature over 40° C. (e.g., about 60° C.). By regulating the temperature, the etch rate may be adjusted as needed. It is understood that the etchant conditions and/or etchant composition may be adjusted for conducting the second etching step, and other etching chemicals may be used.

As shown in FIGS. 6C-6D, the second top portion 1042B is etched away to accessibly expose the top surface 106ts of the top semiconductor layer 1061. At this stage, the patterned mask layer 202 is completely removed. The remaining portion of the cladding layer is spatially separated by the fin structure 100 to form cladding spacers 1042". The lateral dimension 1042W (e.g., the width measured along the Y-direction) of the cladding spacers 1042" may be in a range of about 6 nm to about 14 nm. In some embodiments, the second etching step is stopped allowing a small over-etching into the cladding spacers 1042". For example, the cladding spacers 1042" may be recessed to where the lowest point of the top surface 1042ts of the cladding layer 1042" is below the top surface 106ts of the top semiconductor layer 1061. In the cross-section of FIG. 6D, the recess depth increases from the highest point of the top surface 1042ts intersecting the sidewall of the fin structure 100 toward the lowest point of the top surface 1042ts of the cladding layer 1042" distanced from the top surface 106ts. In some embodiments, the maximum recess depth R1 measured from the top surface 106ts of the top semiconductor layer 1061 to the lowest point of the top surface 1042ts of the cladding layer 1042" is in a range of about 1 nm to about 4 nm. An angle θ is formed by a plane on which the top surface 106ts resides and a tangent line TL1 at the end point of the cladding layer 1042" intersecting the top semiconductor layer 1061. The angle θ may be zero or an acute angle. In some embodiments, the angle θ is in a range from about 0 degree to about 40 degrees.

The two-step etching process may allow faster processing time in comparison with a process using only one type of etchant. For example, exposure to the first etchant may result in the more rapid etching of the cladding layer 1042 (and the patterned mask layer 202, if still present), as compared to the second etchant. That is, the etch rate of the first etchant for the material of the cladding layer (and/or the patterned mask layer) is greater than the etch rate of the second etchant for the material of the cladding layer. Therefore, the first etchant used in the first etching step allows faster processing time. In addition, the two-step etching process may reduce the risk of damaging top semiconductor layer 1061 (e.g., top semiconductor layer having undesired curved top surface) in comparison with an etching process using only one type of etchant. For example, the cladding layer 1042' (and the patterned mask layer 202, if still present) is wet etched by the second etchant that has higher selectivity to the top semiconductor layer 1061, the second etching step may remove the second top portion 1042B without substantially attacking the top semiconductor layer 1061. Therefore, loss of the top semiconductor layer 1061 may be controlled. For example, the top surface 106ts of the top semiconductor layer 1061 is relatively flat compared to the top surface 1042ts of the cladding layer 1042". Such flat top surface may provide various advantages during the subsequent fabrication process.

Figure 7:
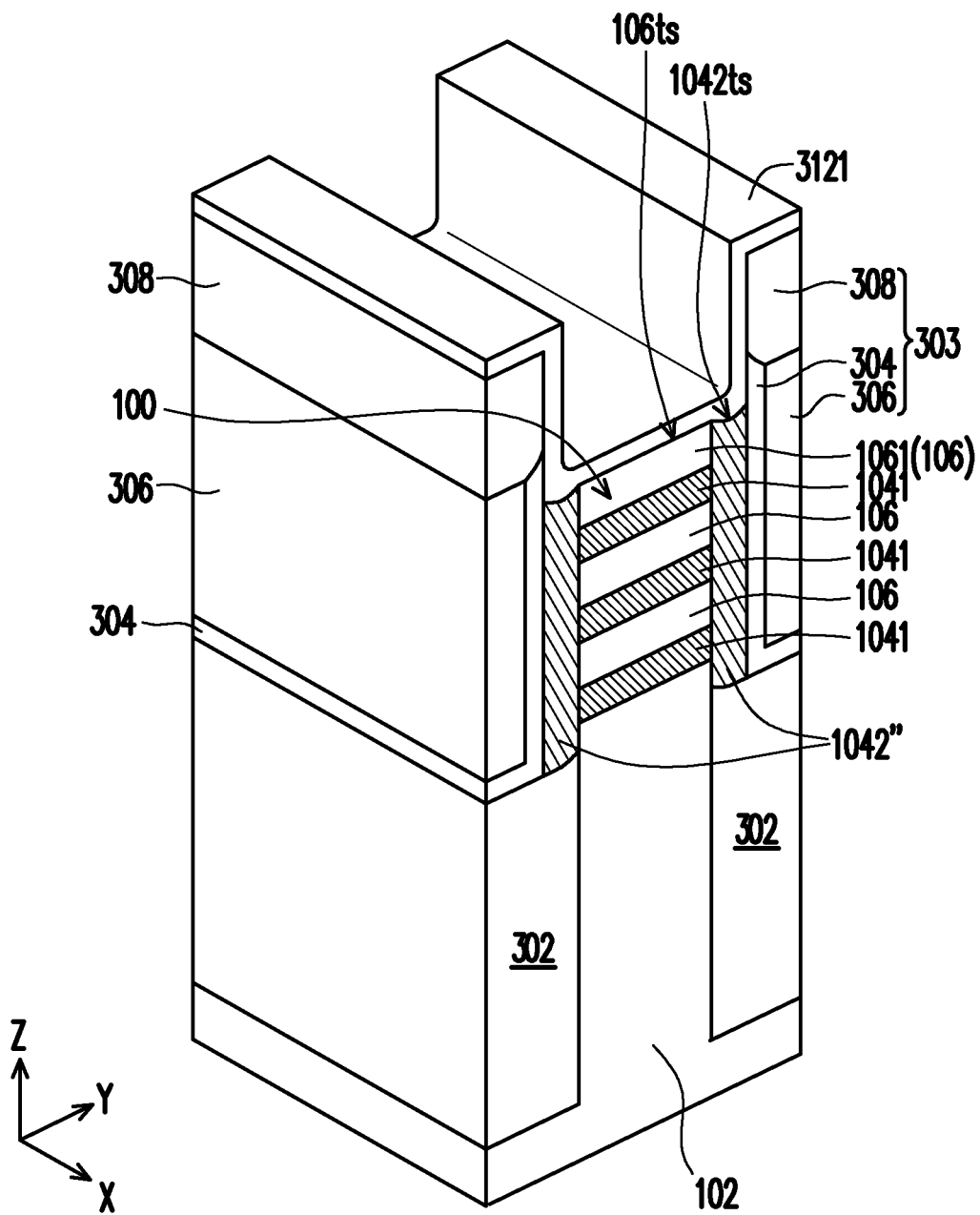
Figure 8:
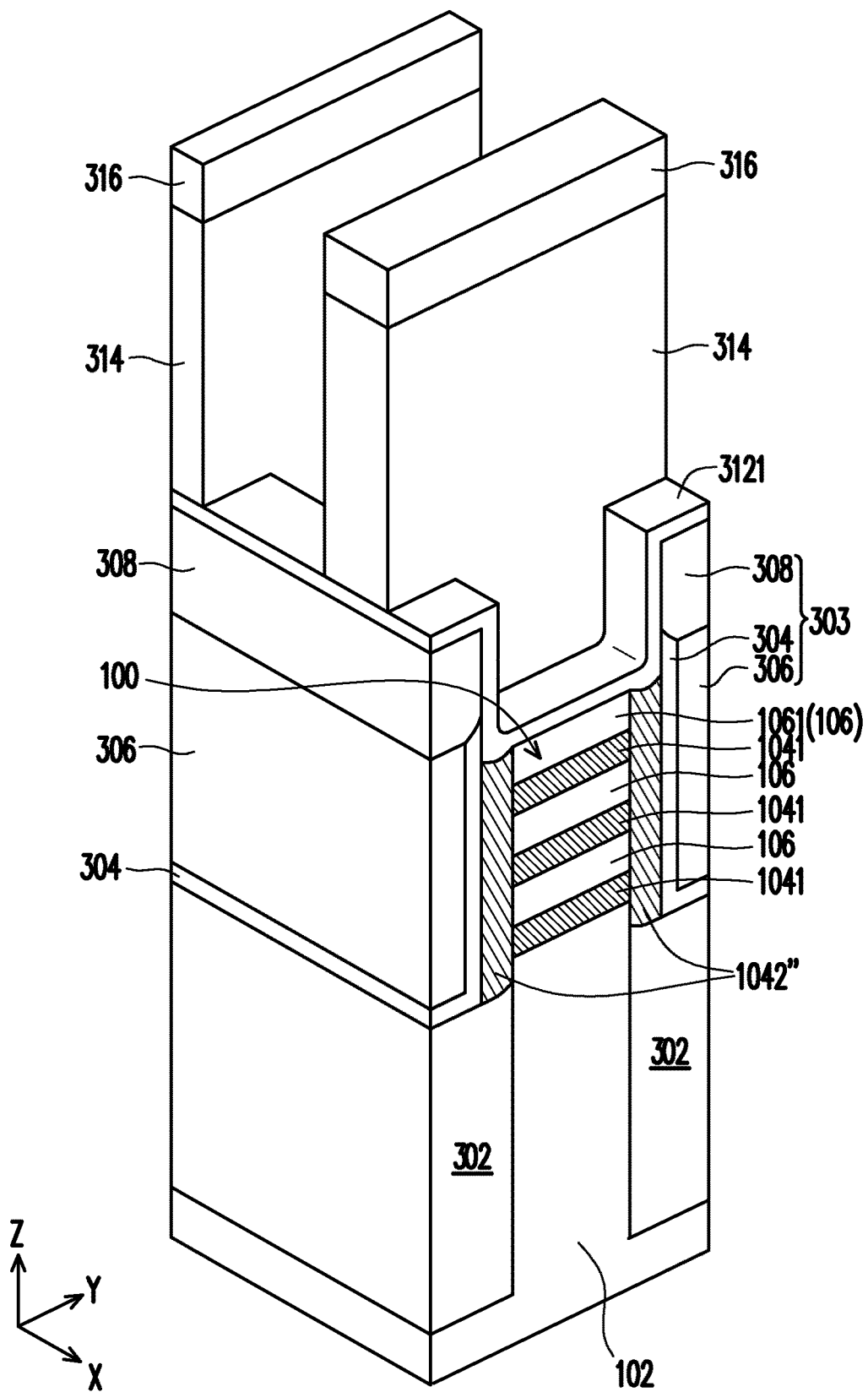

Referring to FIGS. 7-8, a layer of etch stop material 3121 may be blanketly formed over the dielectric structures 303, the cladding layer 1042", and the fin structure 100. For example, the etch stop material 3121 covers the top surfaces and the sidewalls of the dielectric structures 303, the top surfaces 1042ts of the cladding spacers 1042", and the top surface 106ts of the top semiconductor layer 1061. The etch stop material 3121 may include an oxide (e.g., silicon oxide), a nitride, or any other suitable material. Next, as shown in FIG. 8, a plurality of dummy gate strips 314 and patterned mask strips 316 overlying the dummy gate strips 314 may be formed on the etch stop material 3121. In some embodiments, additional dummy gate dielectric strips (not shown) may be formed on the etch stop material 3121, and the dummy gate strips 314 may be formed on these dummy gate dielectric strips. The dummy gate strips 314 may include a silicon-containing material, such as poly-silicon, amorphous silicon, or a combination thereof. The patterned mask strips 316 may be formed of, e.g., an oxide, a nitride, a combination thereof, or the like. The respective patterned mask strip 316 may be a single layer or may include more than one sublayer which depends on process requirements.

Figure 9:
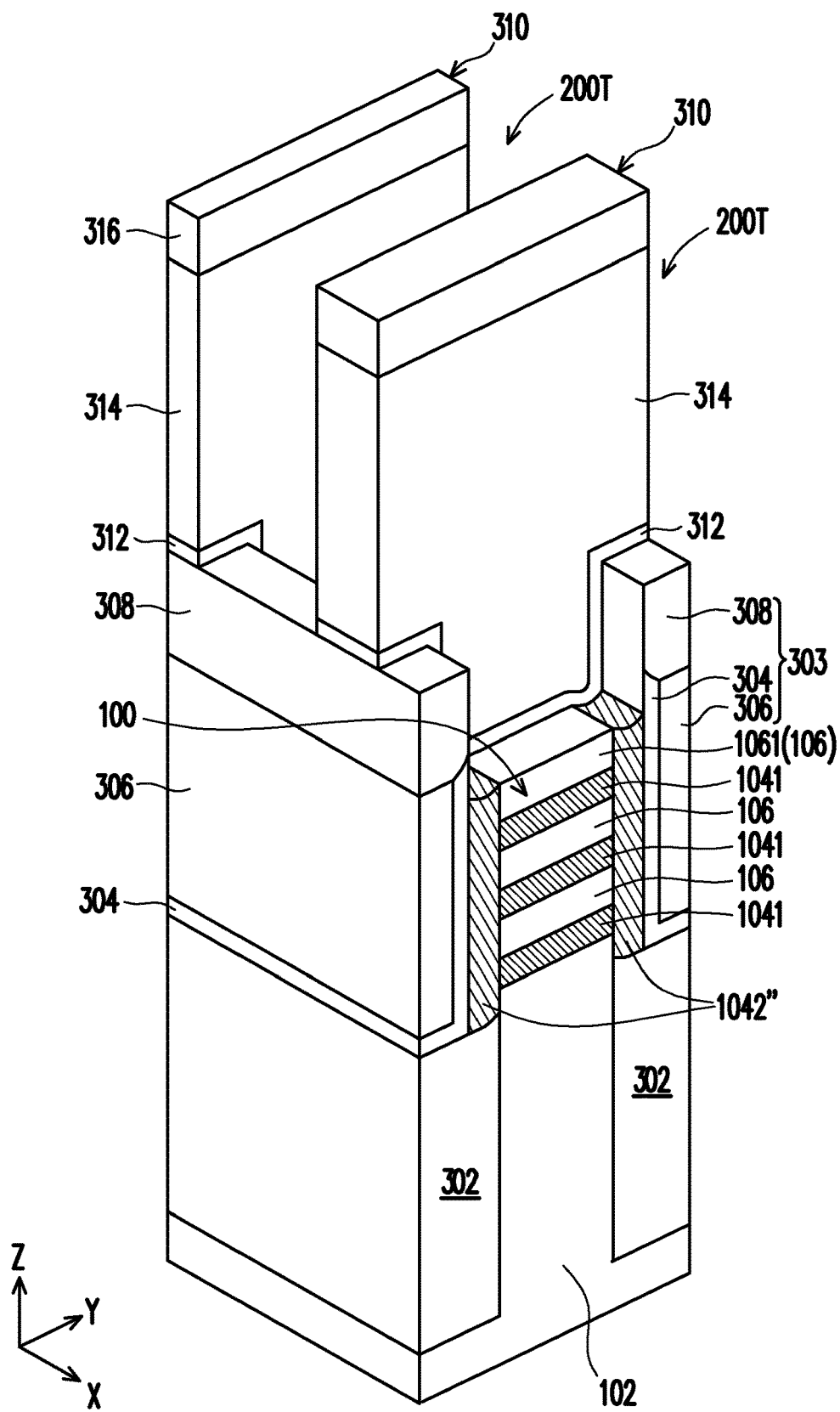

Referring to FIG. 9 and with reference to FIG. 8, a portion of the etch stop material 3121 is removed using the overlying structures as a mask to form etch stop strips 312 underlying the dummy gate strips 314. The etch stop strips 312, the dummy gate strips 314, and the patterned mask strips 316 may be collectively viewed as a dummy gate structures 310. The respective dummy gate structure 310 may be defined between adjacent second trenches 200T. In some embodiments, if the fin structure 100 extends in the X-direction, the dummy gate structures 310 and the second trenches 200T may extend in the Y-direction. That is, an extending direction of the dummy gate structures 310 and an extending direction of the second trenches 200T may be perpendicular to an extending direction of the fin structure 100. Portions of the third dielectric layer 308, the first dielectric layer 304, the cladding layer 1042", and the top semiconductor layer 1061 may be accessibly exposed by the dummy gate structures 310.

Figure 10:
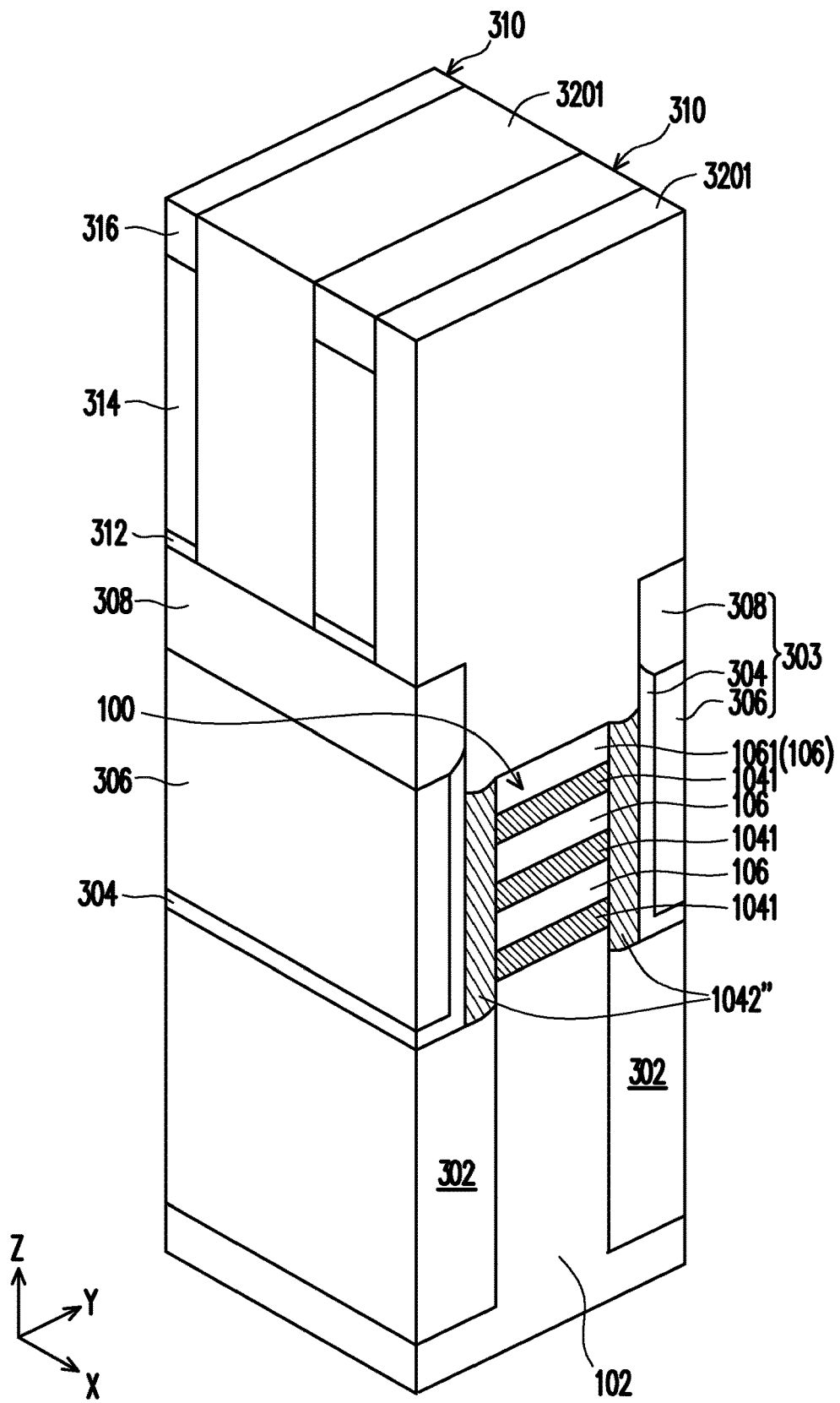
Figure 11:
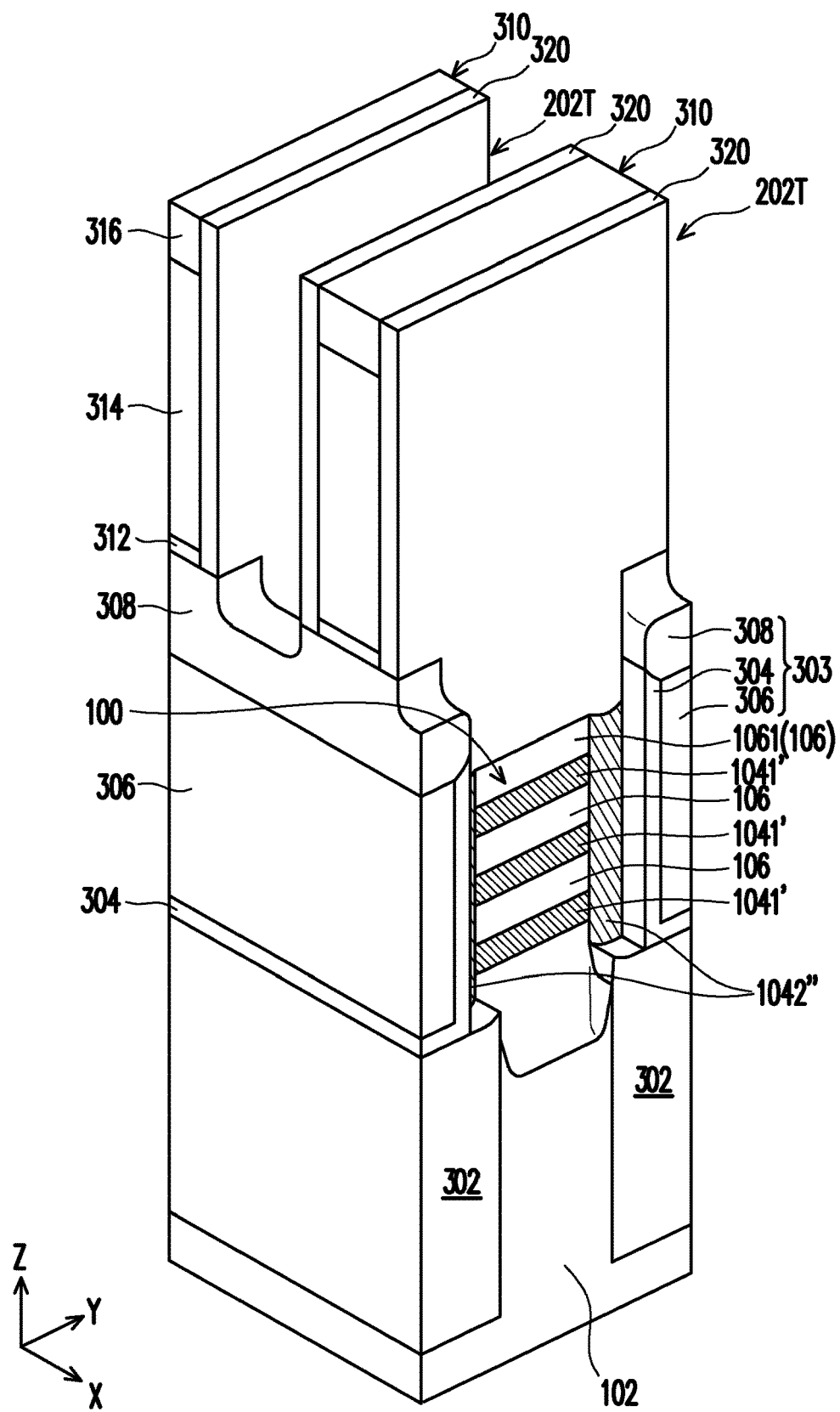

Referring to FIGS. 10-11 with reference to FIG. 9, gate spacer layers 3201 may be formed on the exposed portions of the third dielectric layer 308, the first dielectric layer 304, the cladding layer 1042", and the top semiconductor layer 1061. For example, the gate spacer layers 3201 fill the second trenches 200T and spatially separate the dummy gate structures 310 from one another. The gate spacer layers 3201 may be low-k spacers and may be formed of a suitable dielectric material, such as silicon oxide, silicon oxycarbonitride, or the like. Next, a portion of the respective gate spacer layer 3201 is removed to form gate spacers 320. The gate spacers 320 may be formed on opposing sidewalls (and extend along the Y-direction) of each of the dummy gate structures 310. The shape of the gate spacers 320 as illustrated in FIG. 11 is merely a non-limiting example, and other shapes are possible. A plurality of source/drain (S/D) trenches 202T may be formed between the gate spacers 320 to separate adjacent two of the gate spacers 320. The respective S/D trench 202T may extend along the Z-direction to the semiconductor substrate 102. For example, during the formation of the S/D trenches 202T, not only the portions of the gate spacer layers 3201, but also portions of the third dielectric layer 308, the fin structure 100, and the cladding layer 1042" may be removed. In some embodiments, the outer sidewall (e.g., on the Y-Z plane) of the respective gate spacer 320 is substantially coplanar with the outer sidewall (e.g., on the Y-Z plane) of the underlying fin structure 100 and the outer sidewall (e.g., on the Y-Z plane) of the cladding spacer 1042".

Figure 12A:
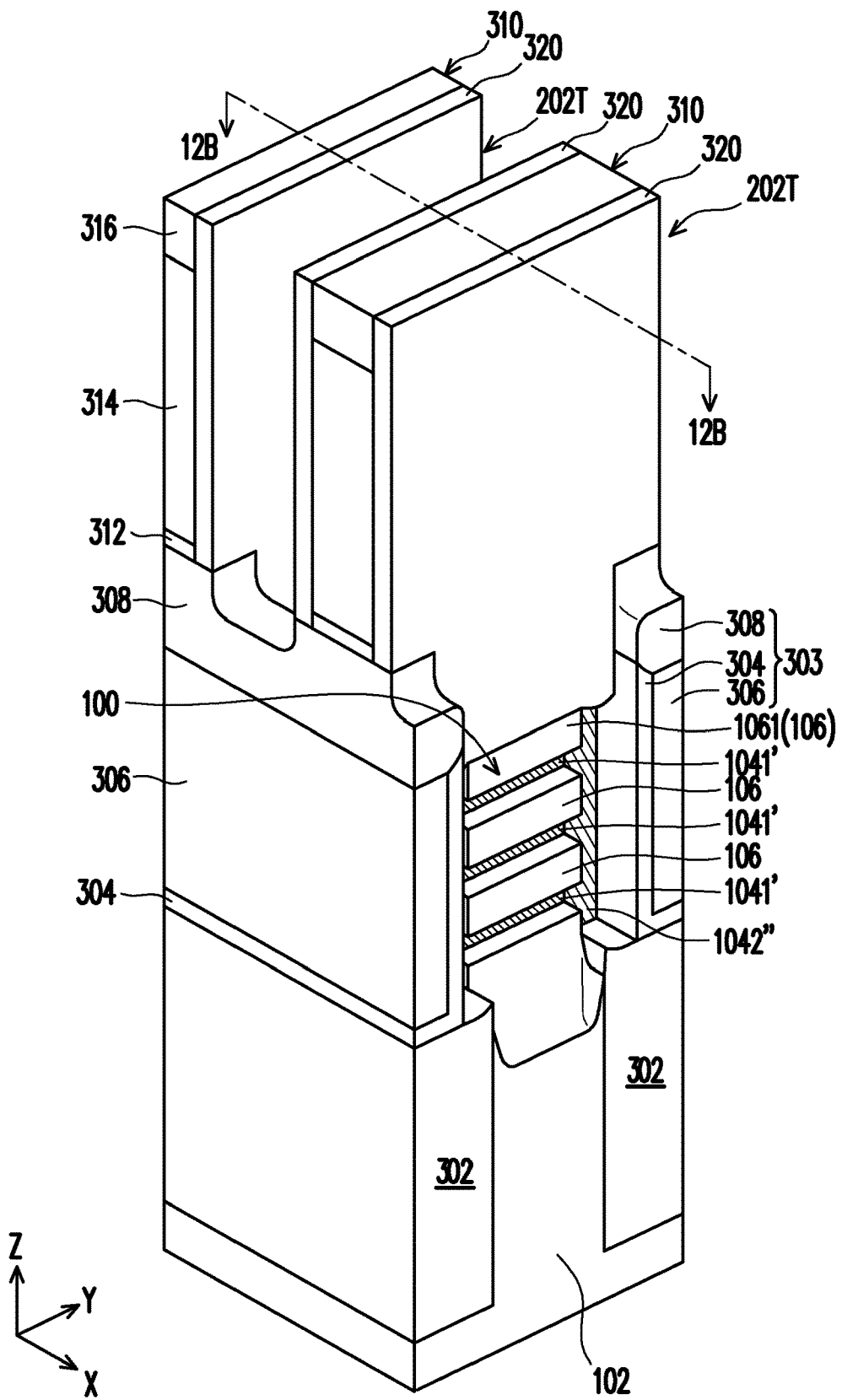
Figure 12B:
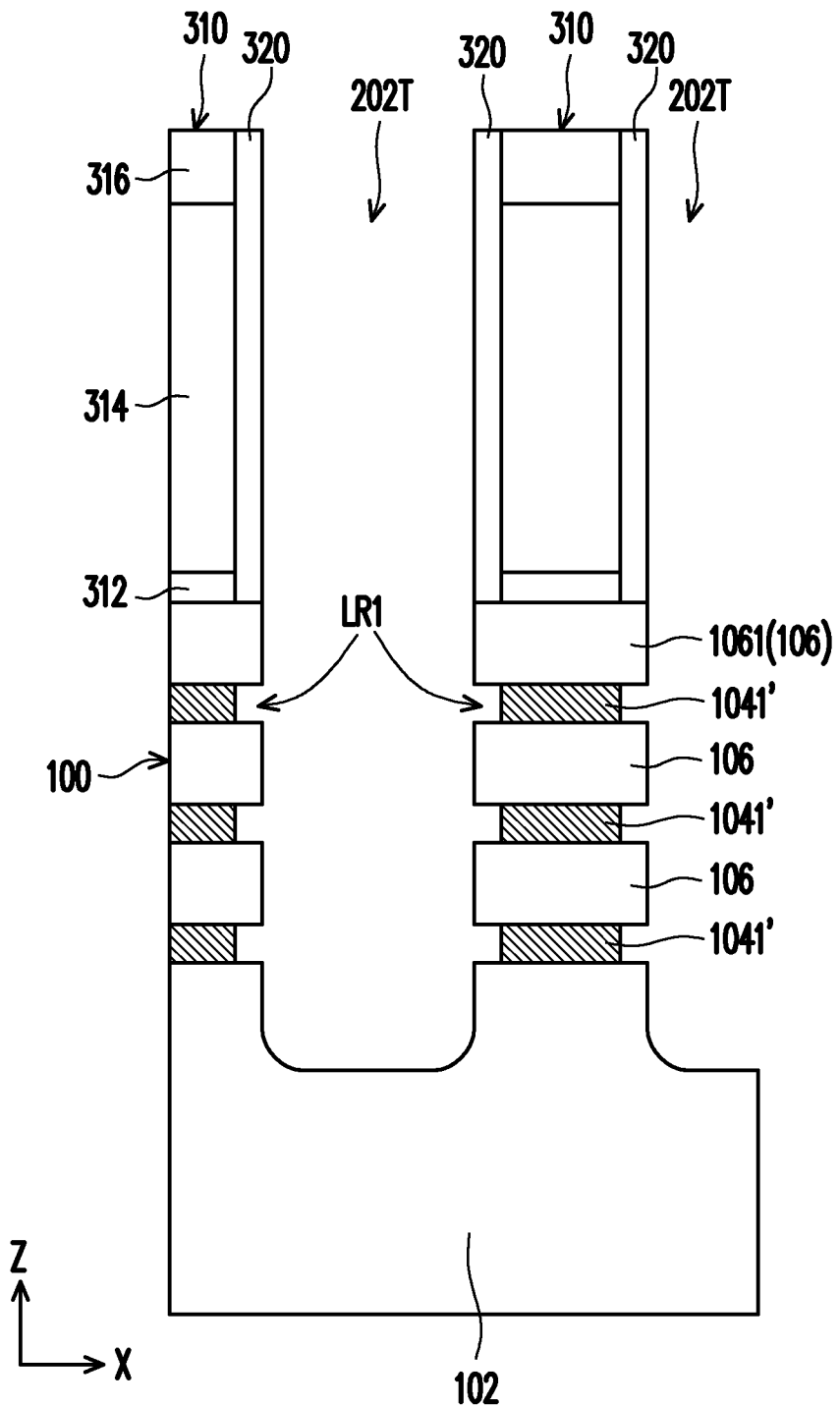
FIGS. 12B and 13B are cross-sectional views of the semiconductor device respectively taken along a line 12B-12B in FIG. 12A and a line 13B-13B in FIG. 13A, in accordance with some embodiments.

Referring to FIGS. 12A-12B and with reference to FIG. 11, a portion of the respective first semiconductor layer 1041 and a portion of the cladding spacers 1042" may be removed to respectively form a respective first semiconductor layer 1041' and cladding spacers 1042'". Upon the ends of the first and second semiconductor layers 1041 and 106 being accessibly exposed by the S/D trenches 202T, respective end portions of each of the first semiconductor layers 1041 and a portion of the cladding spacers 1042" may be concurrently removed, as the first semiconductor layers 1041 and the cladding spacers 1042" include the same (or similar) material. For example, the etchant of the selective etching process may be chosen so that the portions of the first semiconductor layers 1041 and the cladding spacers 1042", while the second semiconductor layers 106 may remain substantially intact during the process. Upon the portion of the respective first semiconductor layer 1041 being removed, lateral recesses LR1 are formed. As shown in the cross-section of FIG. 12B, the respective first semiconductor layer 1041' may be laterally recessed from the sidewalls of the underlying (or overlying) second semiconductor layer 106.

Figure 13A:
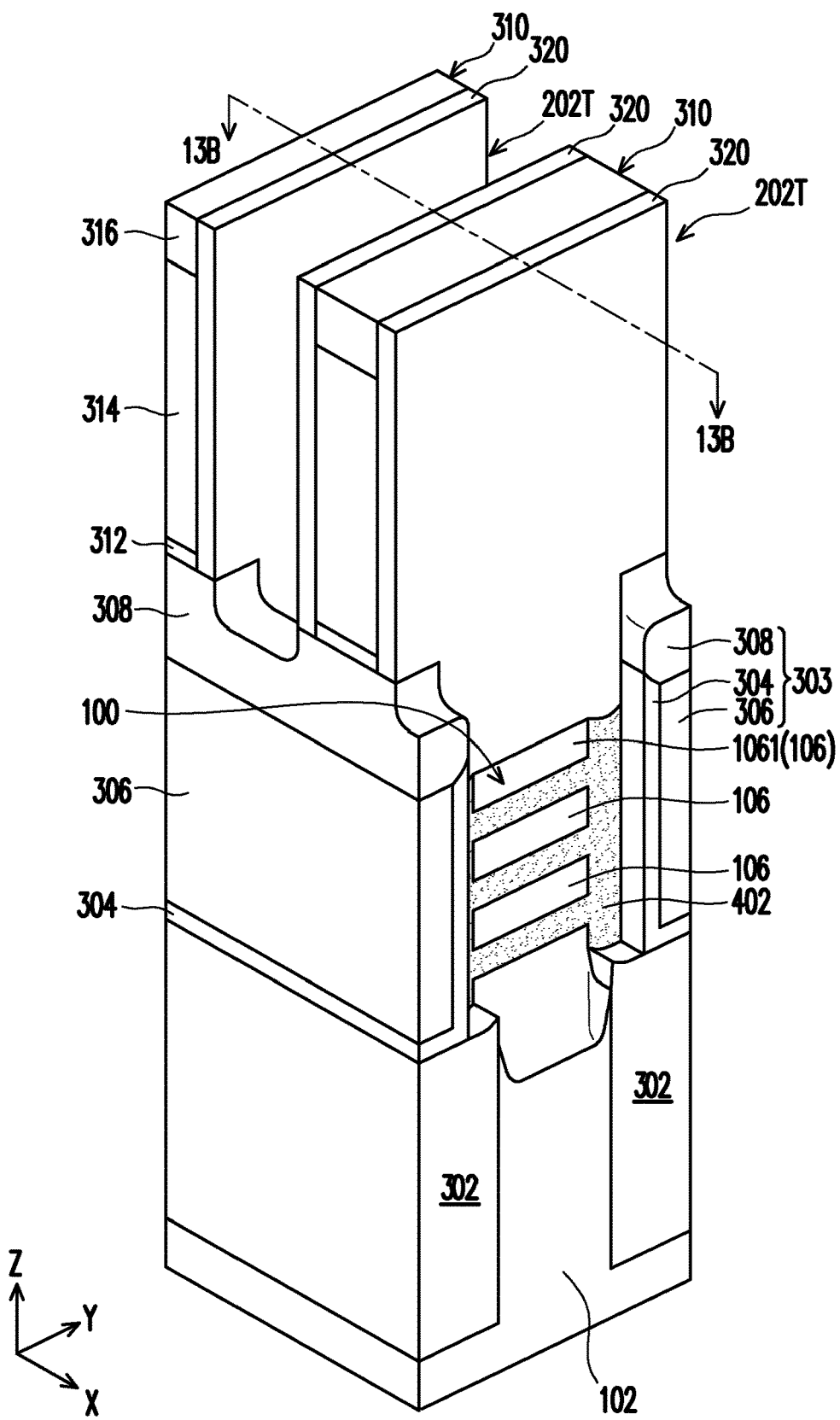
Figure 13B:
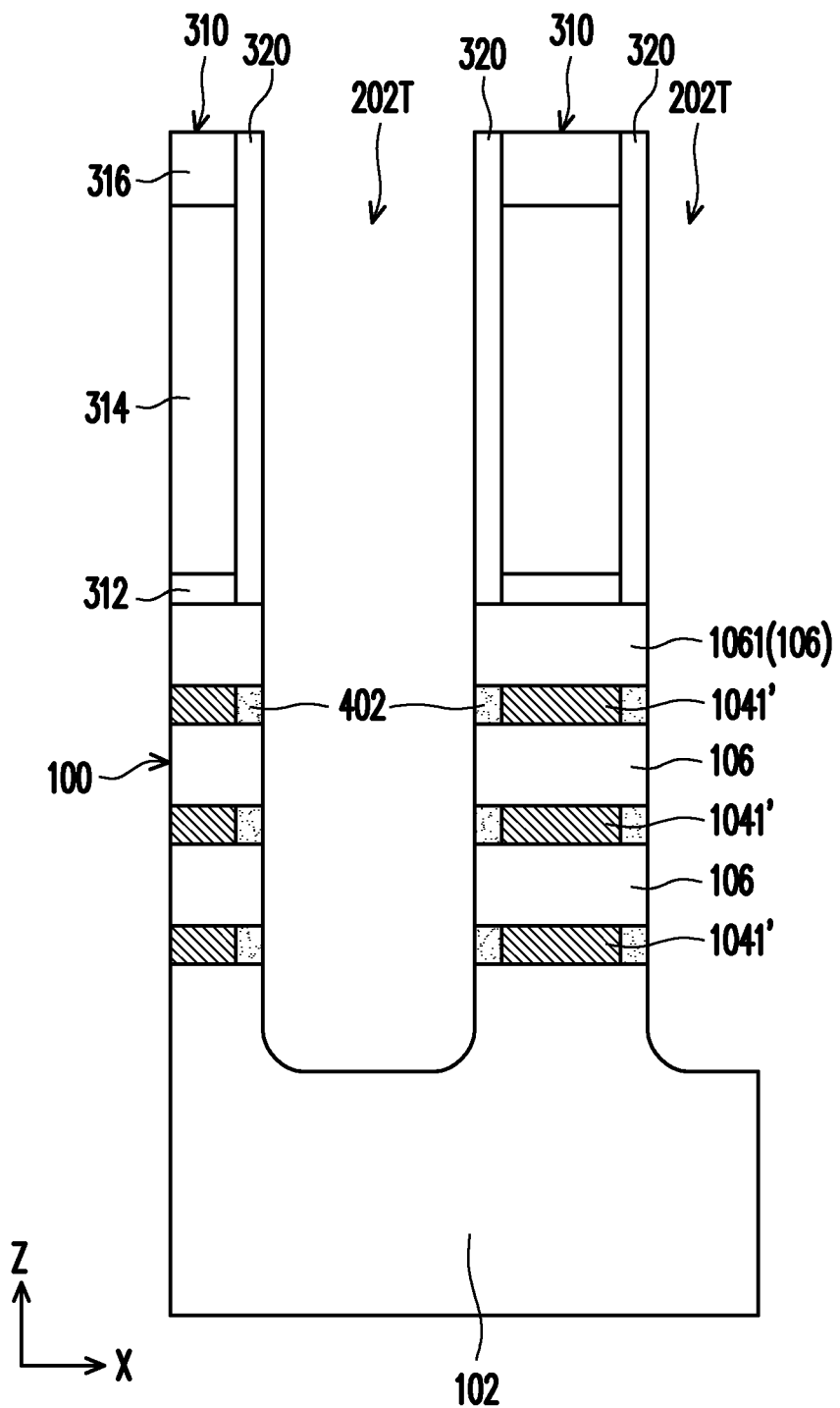

Referring to FIGS. 13A-13B and with reference to FIGS. 12A-12B, inner spacers 402 may be formed in the lateral recesses LR1. For example, the inner spacers 402 are formed along the etched ends of each of the first semiconductor layers 1041' and along respective ends (along the Y-direction) of each of the first and second semiconductor layers 1041' and 106. The inner spacers 402 may cover the cladding spacer 1042'" and extend along the Z-direction. The inner spacers 402 may be deposited using, e.g., a conformal deposition process and subsequent etch back to remove excess spacer material on the sidewalls of the fin structure 100 and on a surface of the semiconductor substrate 102. The gate spacers 320 may serve as etching masks when removing excess spacer material, and thus the outer sidewall of the respective gate spacer 320 may be substantially aligned (or coplanar) with the outer sidewalls of the underlying second semiconductor layers 106 and the inner spacers 402. For example, the inner spacers 402 are formed of silicon nitride, silicon carbonitride, silicon-carbon-oxynitride, or any other type of dielectric material. The inner spacers 402 may be formed from the same or different material as the gate spacers 320.

Referring to FIGS. 14A-14D and with reference to FIGS. 13A-13B, epitaxial structures 410 (e.g., 410N and 410P) are formed in the S/D trenches 202T. The epitaxial structures 410 may be coupled to the exposed surfaces of the second semiconductor layers 106 of the fin structure 100 (along the Y-direction) and the inner spacers 402. In some embodiments, a bottom surface of the epitaxial structures 410 may be substantially leveled with the top surface of the neighboring isolation structure 302. The bottom surface of the epitaxial structures 410 may be lower than the top surface of the neighboring isolation structure 302. The epitaxial structures 410 may each include silicon germanium, indium arsenide, indium gallium arsenide, indium antimonide, germanium arsenide, germanium antimonide, indium aluminum phosphide, indium phosphide, any other suitable material, or combinations thereof. The epitaxial structures 410 may be formed using an epitaxial layer growth process on the exposed surfaces of each of the second semiconductor layers 106 and the inner spacers 402. The material of the epitaxial structures 410 may be doped with a conductive dopant. For example, a strained material is epitaxially grown with an n-type dopant (or a p-type dopant) for straining the epitaxial structures 410N (or 410P) in the n-type region (or the p-type region). That is, the strained material is doped with the n-type dopant (or the p-type dopant) to be the epitaxial structures 410N (or 410P) of the p-type FET (or the n-type FET).

In some embodiments, the material of the epitaxial structures 410N (and/or 410P) is disposed as a multi-layered structure, with different layers having different degrees of doping. Alternatively, the material of the epitaxial structures 410N (or 410P) may be disposed as a single-layered structure. In some embodiments, the respective epitaxial structure 410N includes a base layer NL0 formed on the semiconductor substrate 102, a first layer NL1 covering the base layer NL0, and a second layer NL2 formed on the first layer NL1 and filling the lower portion of the S/D trenches 202T to be in direct contact with the first dielectric layer 304 of the neighboring dielectric structure 303. In some embodiments, the respective epitaxial structure 410P includes a base layer PL0 formed on the semiconductor substrate 102, a first sublayer PL11 covering the base layer NL0, a second sublayer PL1 conformally formed in the corresponding S/D trench 202T, and a second layer PL2 formed on the second sublayer PL1 and filling the lower portion of the S/D trenches 202T.

The base layer NL0 (or PL0) may act as a buffer layer or a spacer between the underlying semiconductor substrate 102 and the overlying first layer NL1 (or PL11). The base layer NL0 (or PL0), the first layer NL1 (or PL11 and PL1), and the second layer NL2 (or PL2) may have a composition (the elements contained therein and the percentages of the elements) different from the composition of the adjacent layer(s). As shown in FIG. 14C, in the n-type region, the first layer NL1 may be formed on the sidewalls of the second semiconductor layers 106, and the second layer NL2 filling the lower portion of the S/D trenches 202T may be in direct contact with the inner spacers 402. As shown in FIG. 14D, in the p-type region, the first sublayer PL11 may be formed on the sidewalls of the second semiconductor layers 106, and the second sublayer PL1 conformally lining the corresponding S/D trench 202T may be in direct contact with the inner spacers 402. It should be noted that the epitaxial structures 410 may have other types of configurations, while remaining within the scope of present disclosure.

Figure 14A:
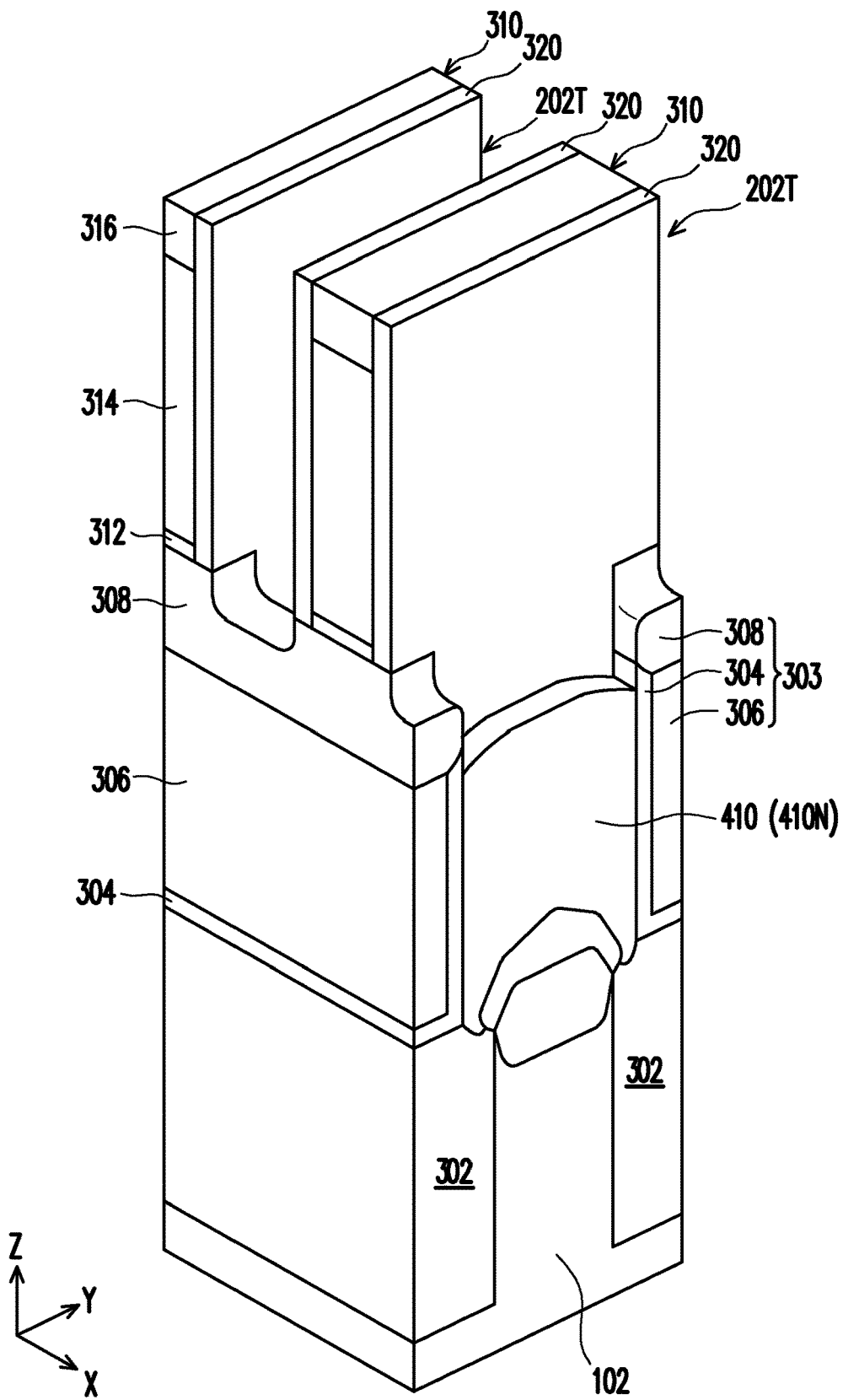
Figure 14B:
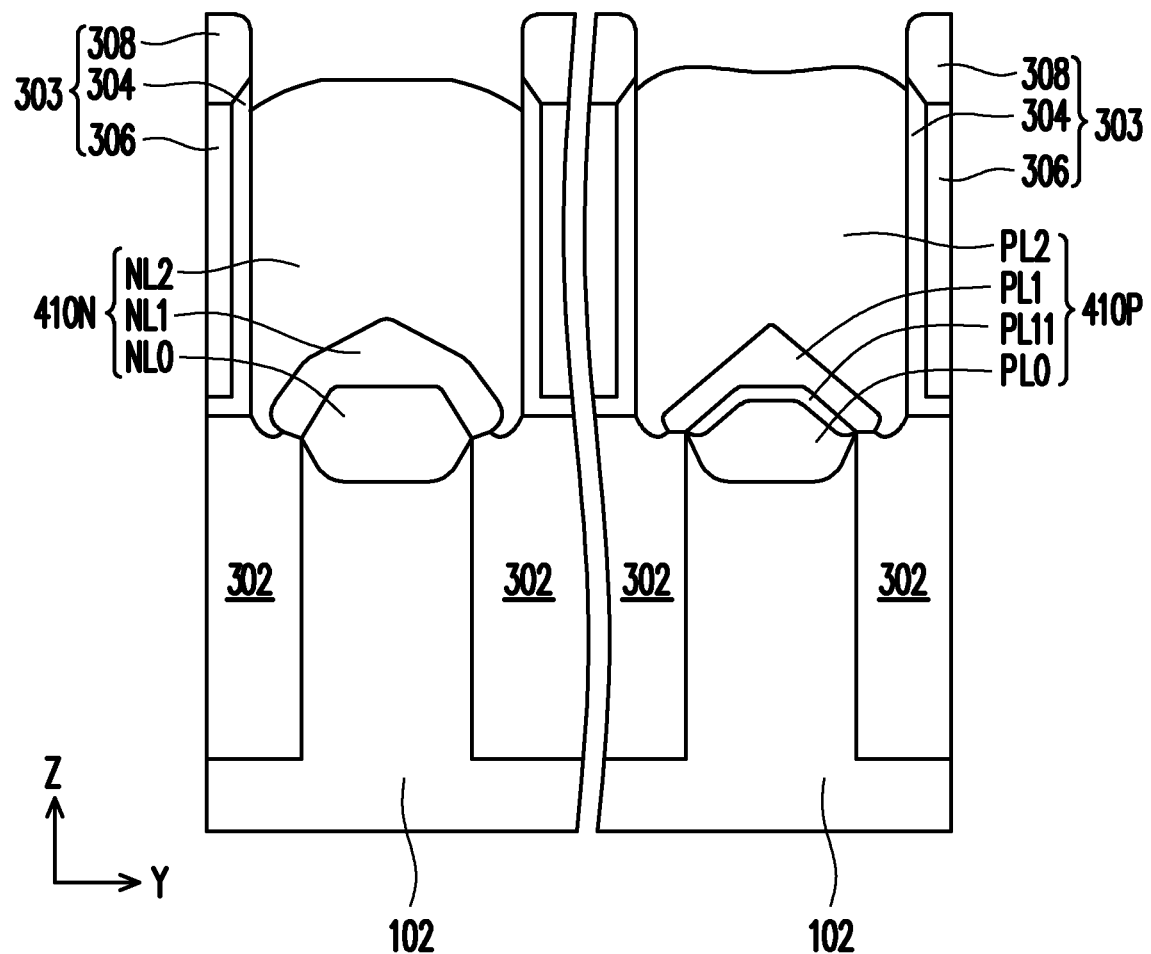
Figure 14C:
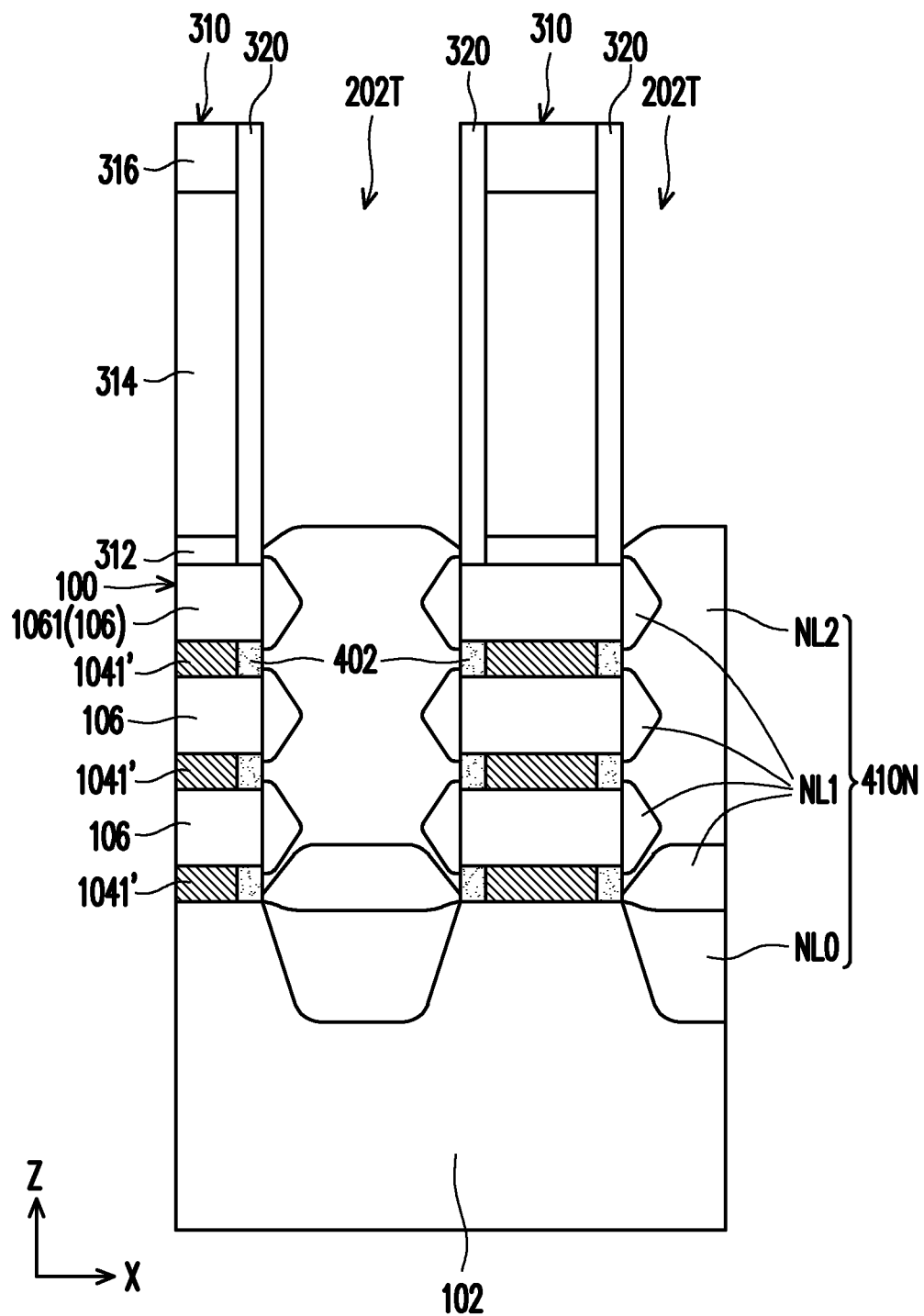
FIGS. 14C-14D, 16C-16D, and 17C-17E are cross-sectional views of the semiconductor device along the X-direction, where FIGS. 14C-14D, 16C-16D, and 17C-17E correspond to FIGS. 14A, 16A, and 17A, respectively, in accordance with some embodiments.
Figure 14D:
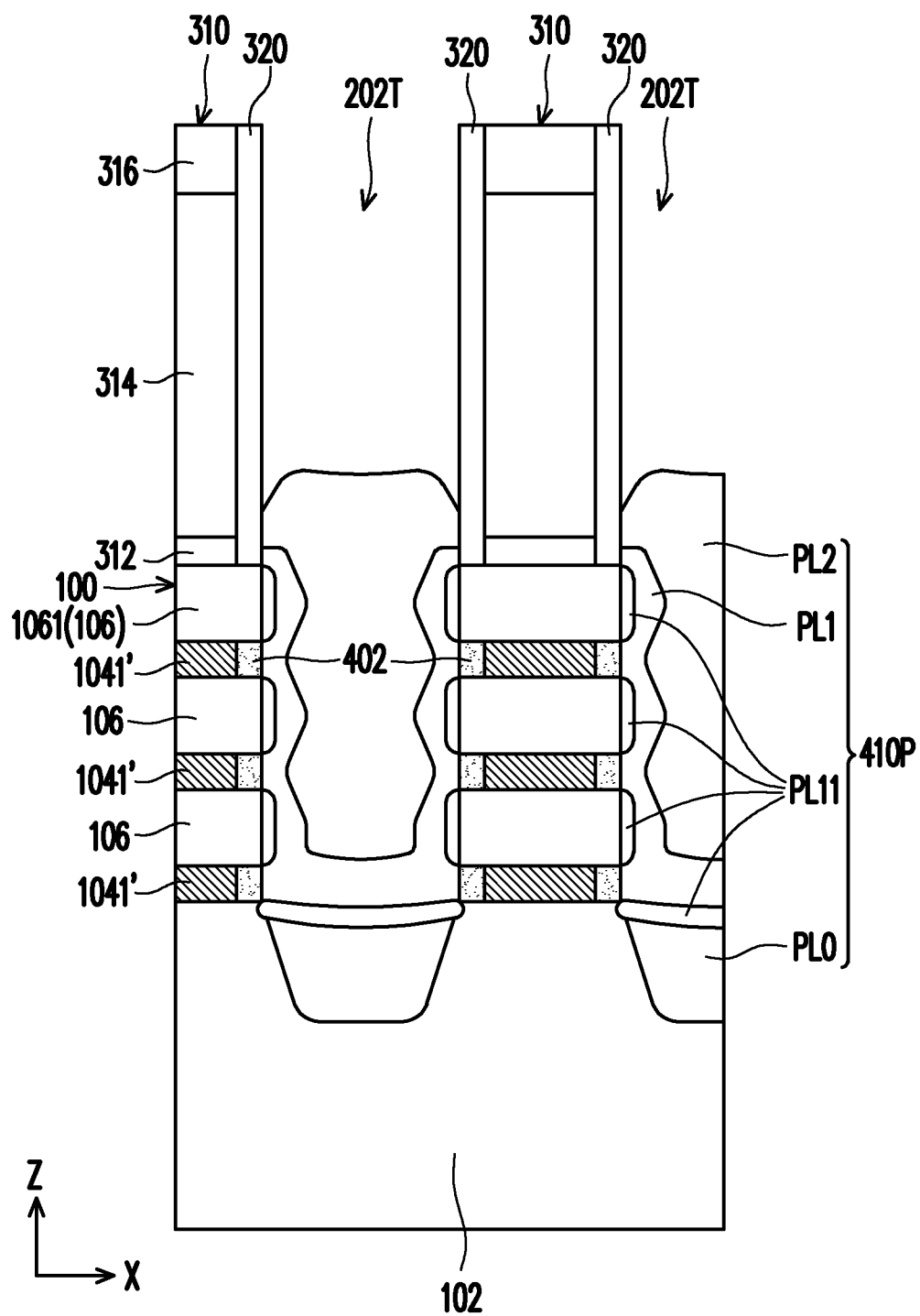
Figure 15:
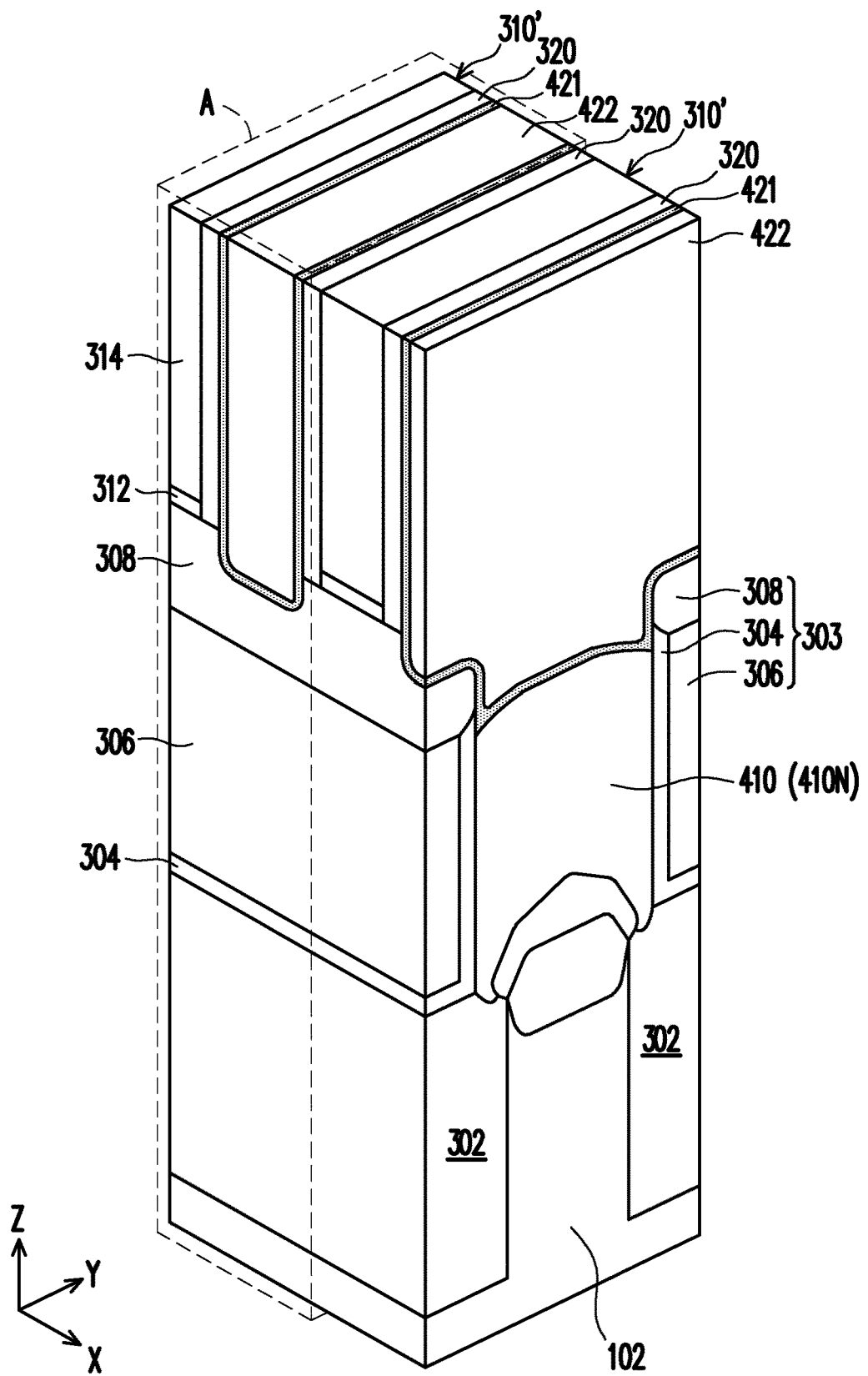

Referring to FIG. 15 and with reference to FIG. 14A, interlayer dielectric (ILD) strips 422 may be formed on opposing sides (along the Y-direction) of each dummy gate structure 310' to overlay the epitaxial structures 410 and the dielectric structures 303, with an etch stop layer 421 disposed therebetween. The etch stop layer 421 may include a suitable material such as silicon oxide, silicon nitride, silicon oxynitride, combinations thereof, or the like. The ILD strips 422 may be formed of a dielectric material such as silicon oxide, phosphosilicate glass (PSG), borosilicate glass (BSG), boron-doped phosphosilicate Glass (BPSG), undoped silicate glass (USG), or the like. In some embodiments, a material layer of the etch stop layer 421 may be conformally formed over the epitaxial structures 410 and the dielectric structures 303, and the dummy gate structures 310. Next, a material layer of the ILD strips 422 may be formed over the etch stop layer 421 and fills the respective S/D trenches 202T. Subsequently, a planarization process (e.g., a CMP process) may be performed to remove excess materials of the etch stop layer 421 and the ILD strips 422. In some embodiments, the planarization process may also remove the patterned mask strips 316 to form the dummy gate structures 310'. After the planarization process, the top surfaces of the ILD strips 422 and the etch stop layer 421 may be substantially leveled (or coplanar) with top surfaces of the dummy gate structures 310', within process variations.

Figure 16A:
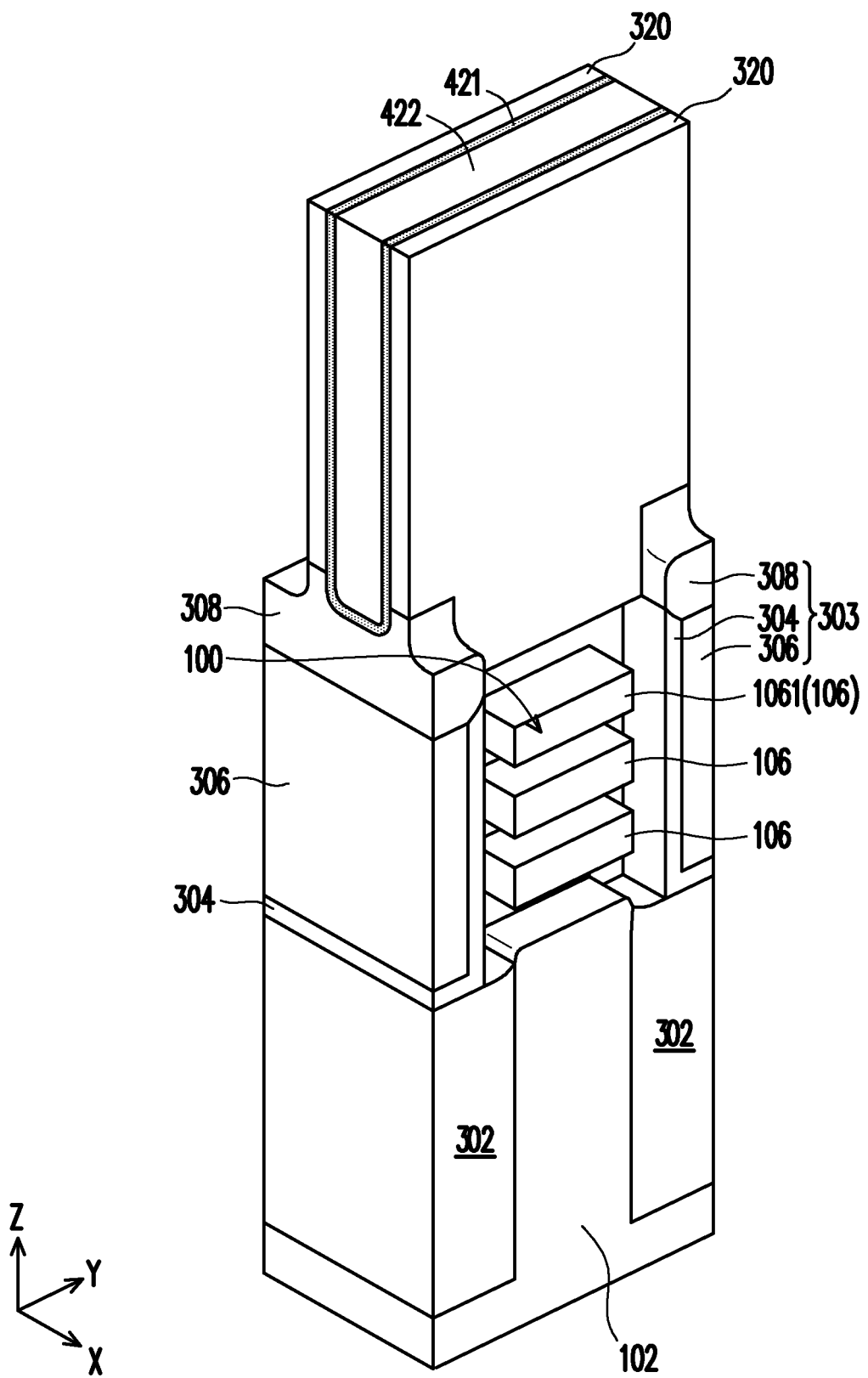
Figure 16B:
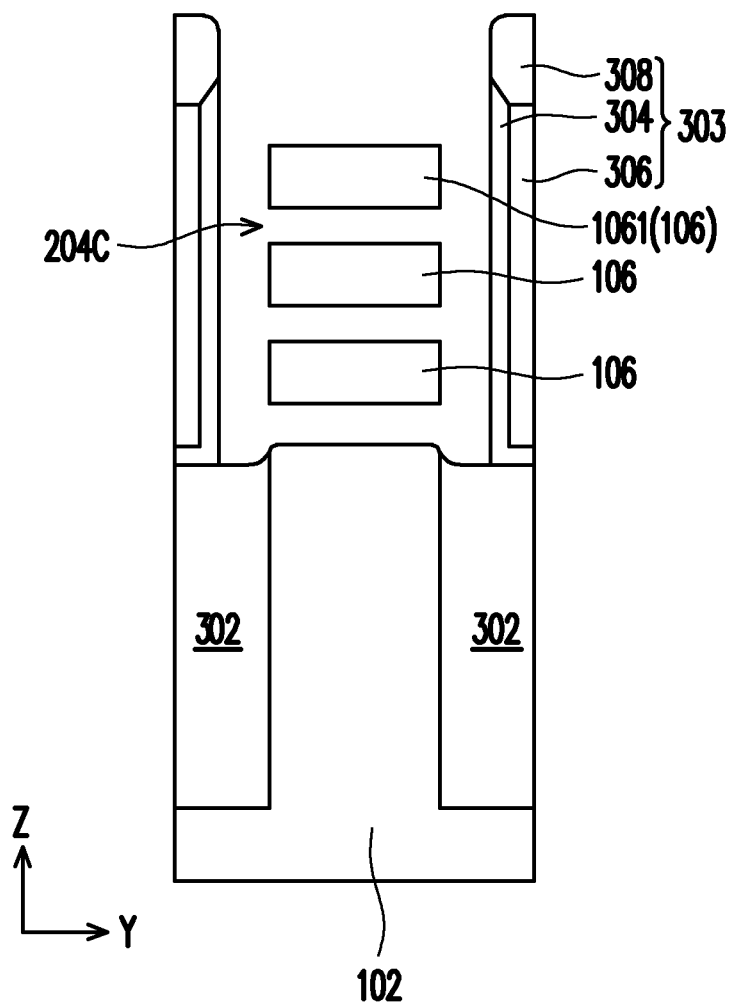
Figure 16C:
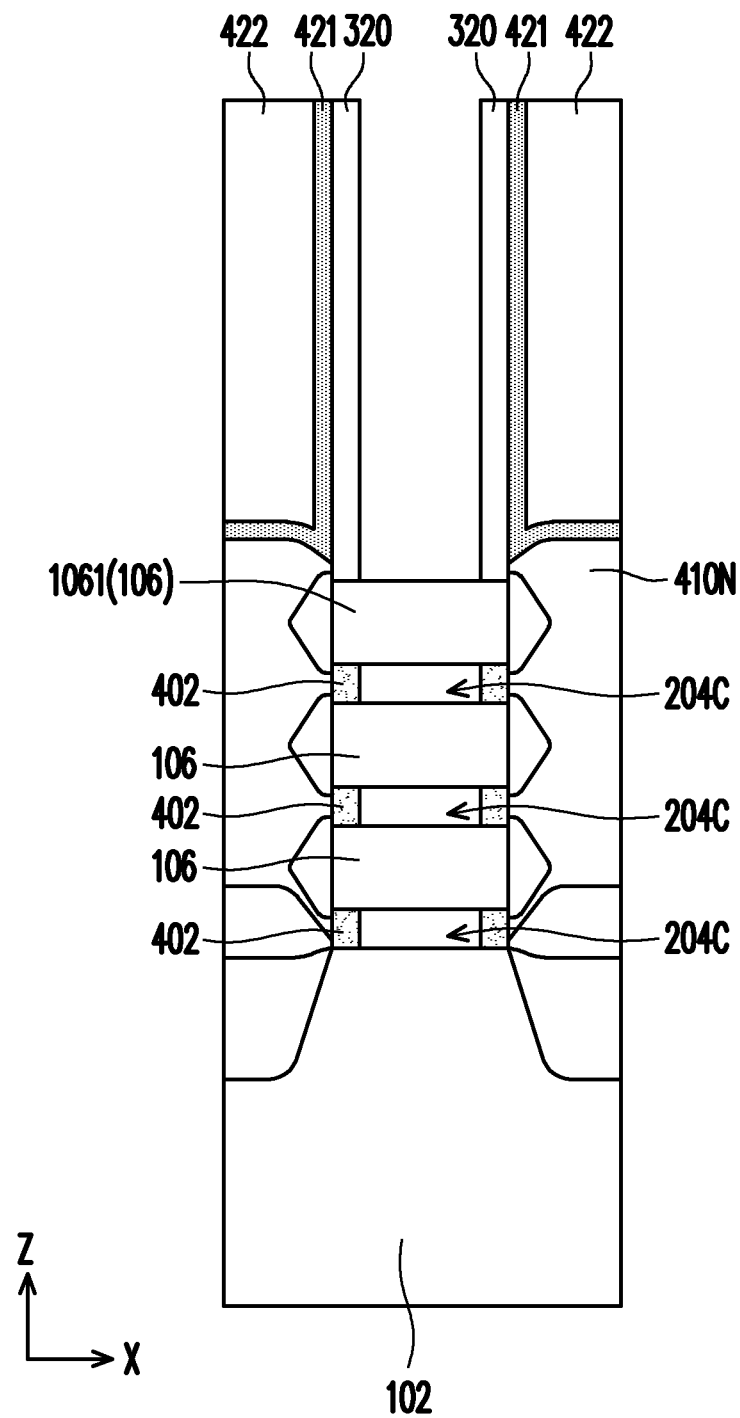
Figure 16D:
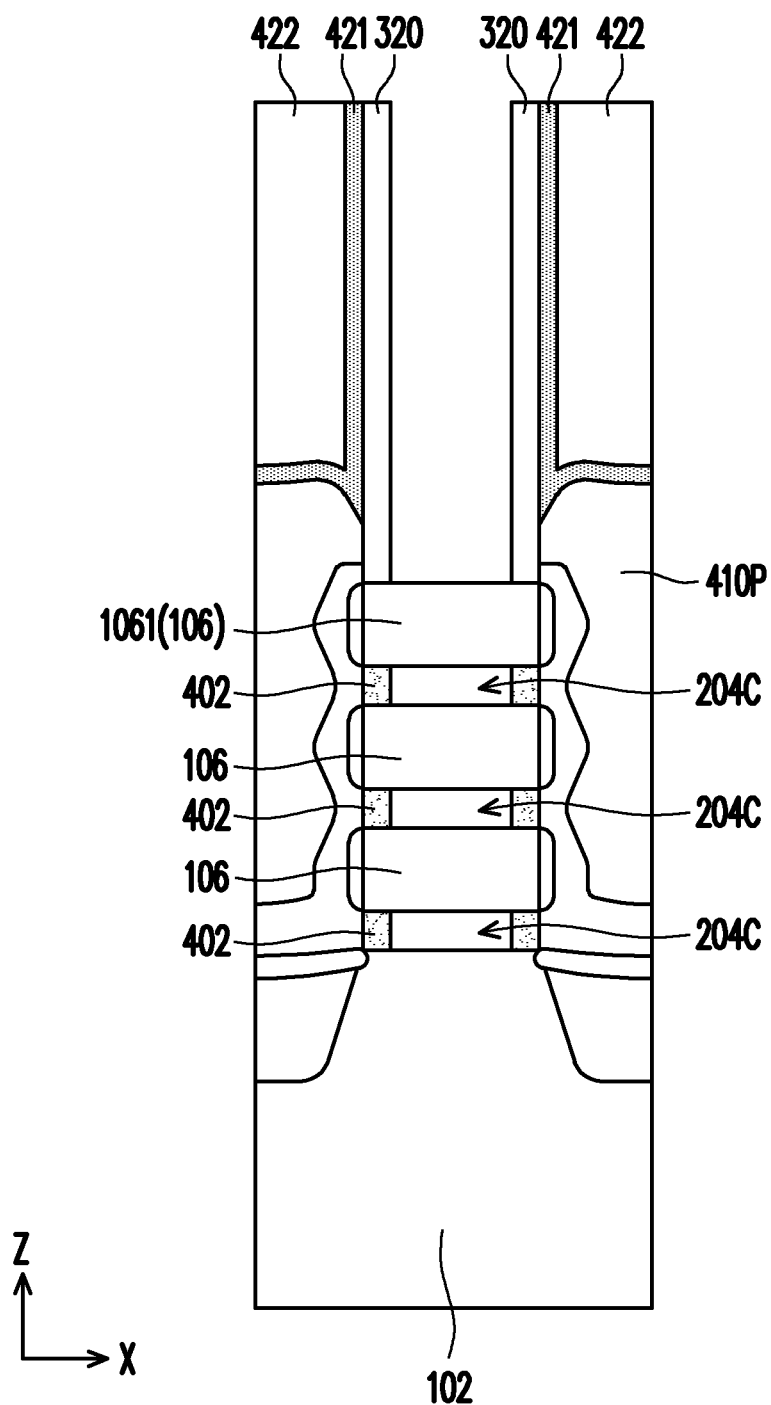

Referring to FIGS. 16A-16D, it should be noted that FIG. 16A illustrates only the portion A outlined in FIG. 15 for clarity of illustration, and thus some layers/structures are not shown in this perspective view. As shown in FIGS. 16A-16B and with reference to FIG. 15, the dummy gate structures 310' including the dummy gate strips 314 and the underlying etch stop strips 312, and the first semiconductor layers 1041' are sequentially removed to form cavities 204C. For example, the dummy gate structures 310' are first removed by an etching process or any other suitable process. After removing the dummy gate structures 310', the top surface of the fin structure 100 (e.g., the top surface of the top semiconductor layer 1061) and the top surface of the cladding spacer 1042''' (see FIG. 12A) may be accessibly exposed. Next, the first semiconductor layers 1041' and the cladding spacer 1042''' that are formed of the same (or similar) material may be removed from the fin structure 100 by applying a selective etching process, while leaving the second semiconductor layers 106 substantially intact. During the removal process, the ILD strips 422 and the etch stop layer 421 may protect the epitaxial structures 410. After the removal of the first semiconductor layers 1041' and the cladding spacer 1042''', respective bottom surface and top surface of each of the second semiconductor layers 106 may be exposed. As shown in FIGS. 16C-16D, the inner spacers 402 remain under the gate spacers 320.

Figure 17A:
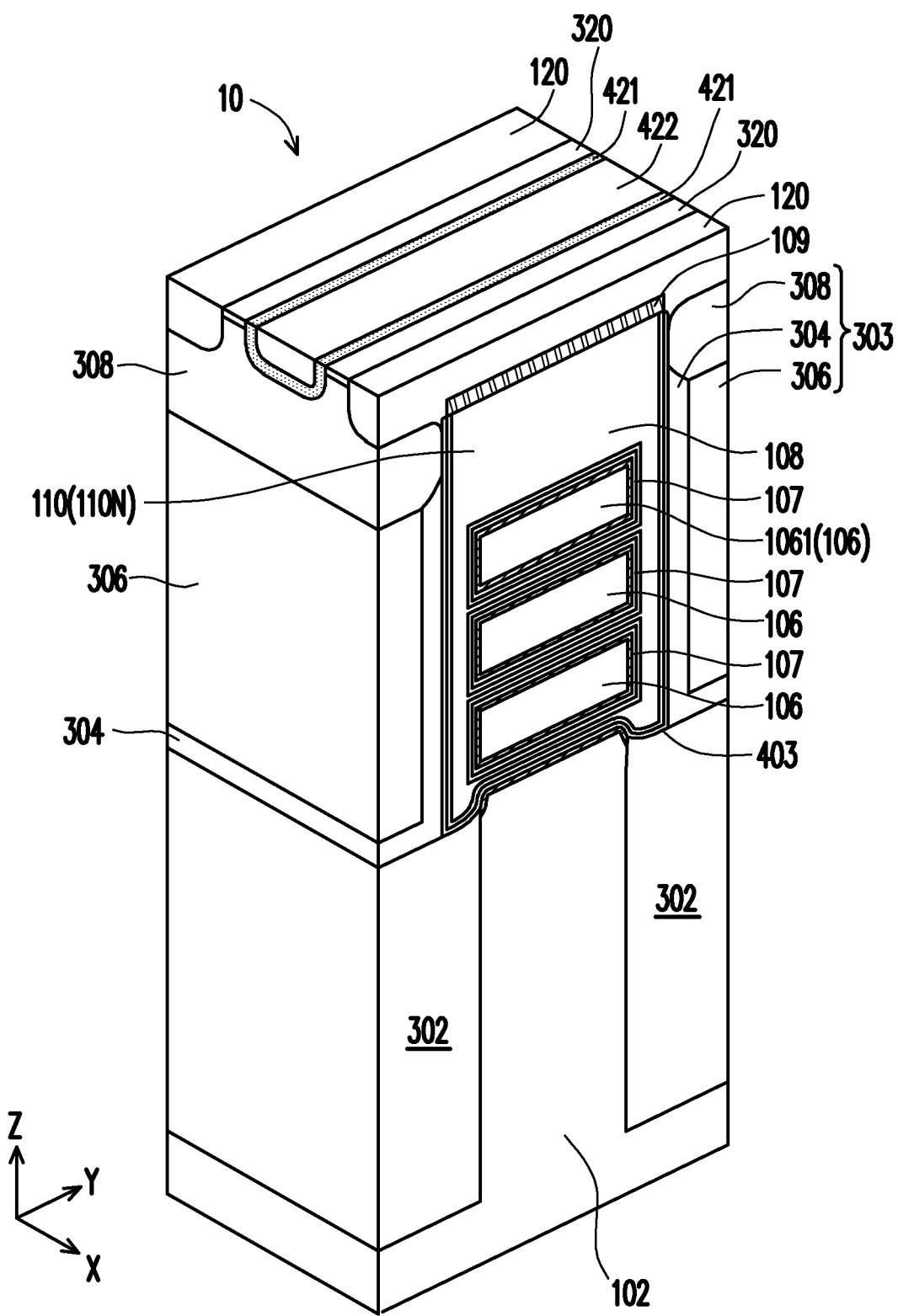
Figure 17B:
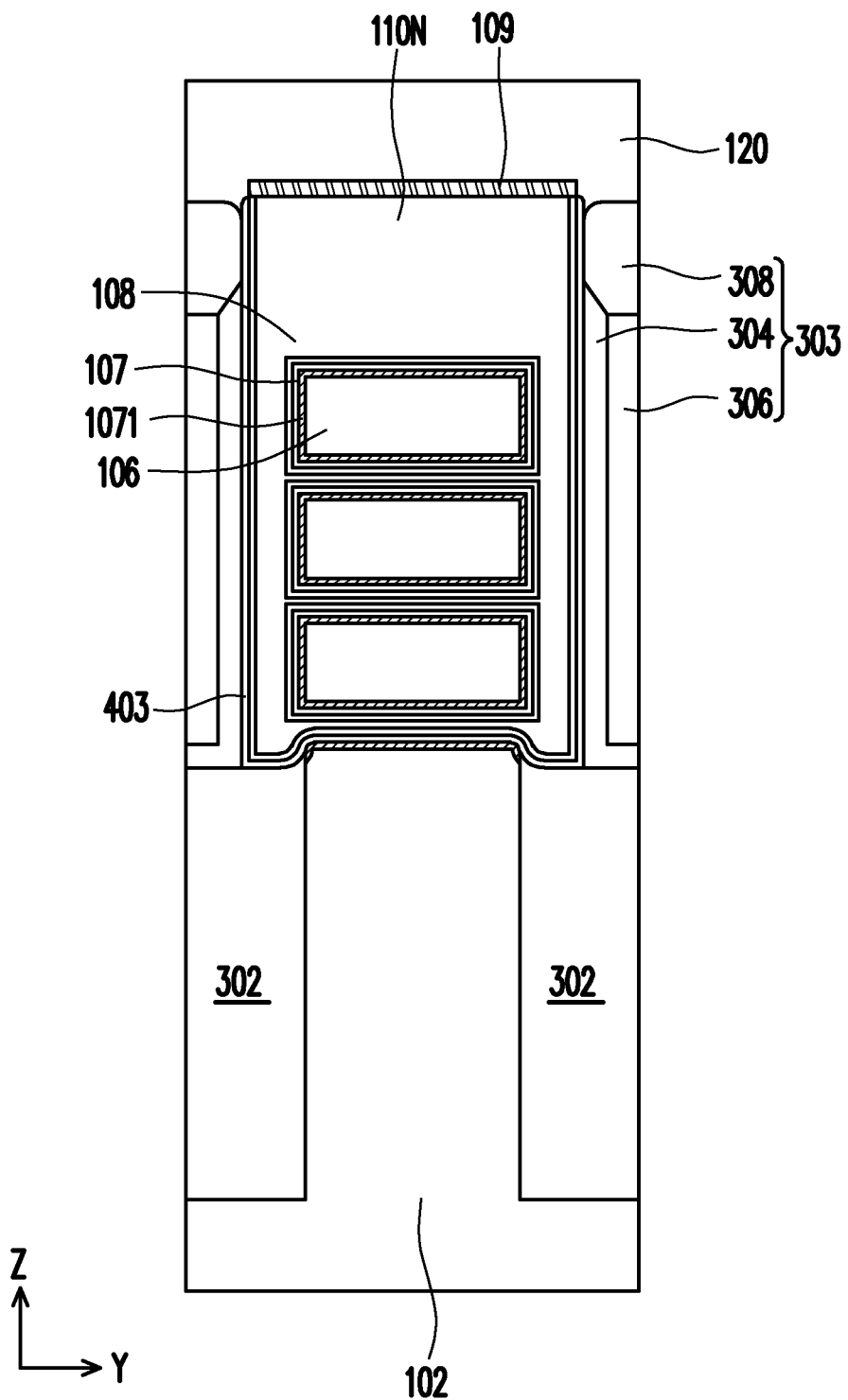
Figure 17C:
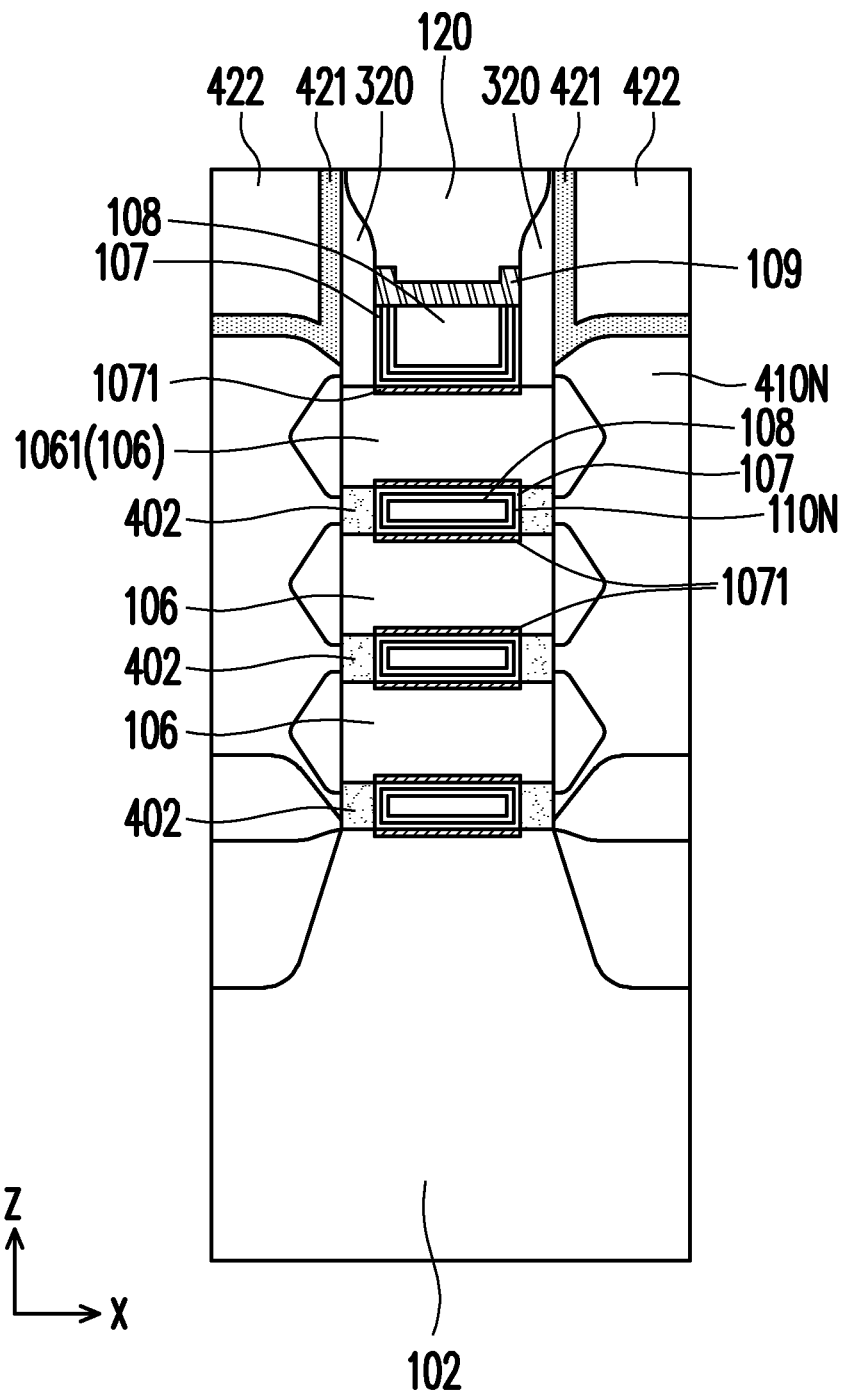
Figure 17D:
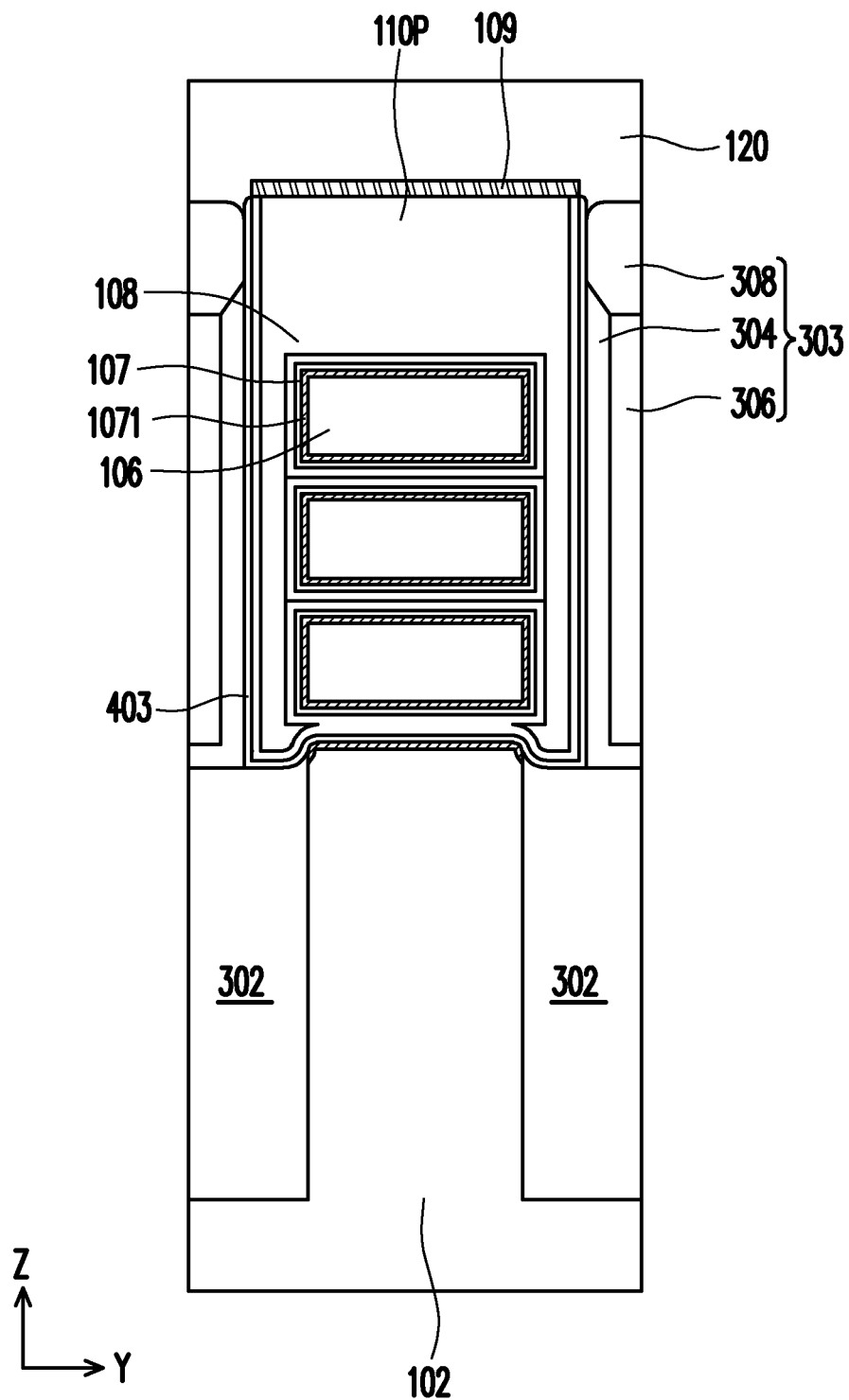
Figure 17E:
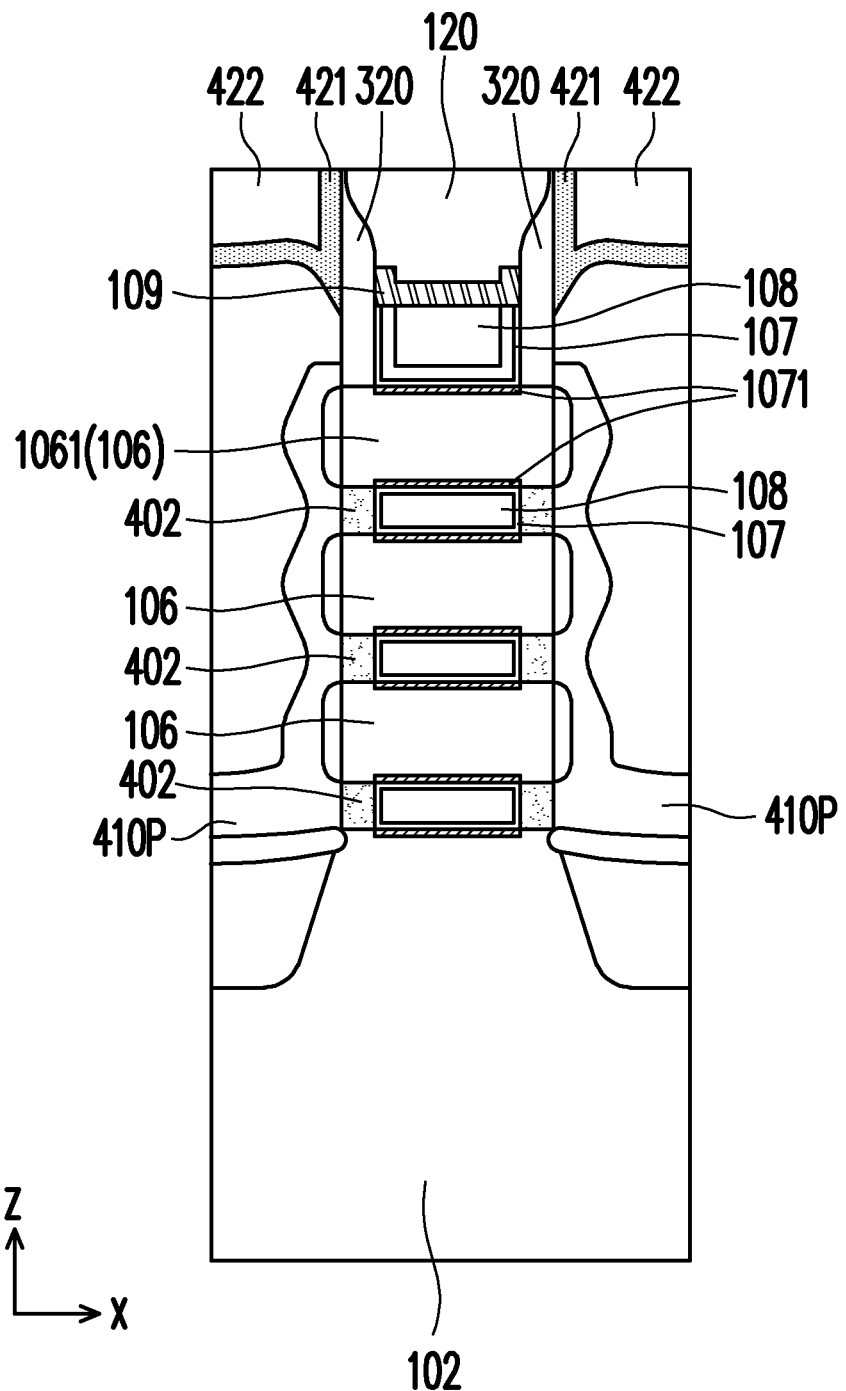

Referring to FIGS. 17A-17E, it should also be noted that FIG. 17A illustrates the corresponding portion A outlined in FIG. 15 after releasing the second semiconductor layers 106 for a better understanding of the concepts of the present disclosure. FIGS. 17B-17C show different cross-sections of the structure in the n-type region, while FIGS. 17D-17E show different cross-sections of the structure in the p-type region. As shown in FIGS. 17A-17E and with reference to FIG. 16A, after releasing the second semiconductor layers 106, a gate structure 110 may be formed around the second semiconductor layers 106 and fills the cavities 204C. The respective gate structure includes a gate dielectric layer 107 wrapping around each second semiconductor layer 106, and a gate metal layer 108 wrapping around each second semiconductor layer 106 with the gate dielectric layer 107 disposed therebetween, where the second semiconductor layers 106 (sometimes referred to as semiconductor nanowires) function as channel regions. In some embodiments, before forming the gate structure 110, a dielectric liner 403 lining the cavities 204C is disposed in between and isolates the gate structure 110 along the Y-direction. The dielectric liner 403 may a single high-k dielectric material or may include a stack of multiple high-k dielectric materials.

The gate dielectric layer 107 of the gate structure 110 may be a single high-k dielectric material or may include a stack of multiple high-k dielectric materials. Other suitable dielectric material(s) may be used to form the gate dielectric layer 107. In some embodiments, an interfacial layer 1071 is formed between each second semiconductor layer 106 and the gate dielectric layer 107. The gate metal layer 108 may include a number of sections abutted to each other along the Z-direction, each of the gate metal sections may extend not only along a horizontal plane (e.g., the X-Y plane), but also along a vertical direction (e.g., the Z-direction), and thus two adjacent ones of the gate metal sections may adjoin together to wrap around a corresponding one of the second semiconductor layers 106, with the gate dielectric layer 107 disposed therebetween.

The gate metal layer 108 may include a stack of multiple metal materials. For example, one or more work function sublayers are interposed between the gate dielectric layer 107 and the gate metal layer 108. The gate metal layer 108 of the gate structure 110P may include p-type work function sublayer(s), while the gate metal layer 108 of the gate structure 110N may include n-type work function sublayer(s). The work function sublayers may be formed separately for the n-type FET and the p-type FET which may use different metal layers. Example p-type work function metal sublayer that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metal sublayer that may include Ti, Ag, TaAl, TaAlC, TiAlN, TaC, TaCN, TaSiN, Mn, Zr, other suitable n-type work function materials, or combinations thereof.

As shown in FIG. 17C and with reference to FIG. 16C, the cross-section cut along the X-Z plane shows that each gate structure 110N is formed in one of the cavities 204C. Similarly, as shown in FIGS. 17D, the cross-section cut along the X-Z plane shows that each gate structure 110P is formed in one of the cavities 204C. For example, the interfacial layer 1071 is formed on the top and bottom surfaces of the second semiconductor layers 106 accessibly exposed by the cavities 204C, and then the gate dielectric layer 107 is formed on the interfacial layer 1071 and also formed on the sidewalls of the inner spacers 402. Subsequently, the gate metal layer 108 including the word function sublayer(s) and the filled metallic sublayer may be formed in the rest space of the cavities 204C.

In some embodiments, after sequentially depositing the materials of the gate structure 110, an upper portion of the materials of the gate structure 110 may be removed by a planarizing process, e.g., a CMP process, until the third dielectric layers 308 of the dielectric structures 303 are accessibly exposed. Next, the remaining portion of the material of the gate metal layer 108 may be etched back so that the third dielectric layers 308 of the dielectric structures 303 may be protruded above a top surface of the gate metal layer 108. Next, a conductive layer 109 may be selectively formed over the gate metal layer 108 to reduce the resistance of the gate metal layer 108. The conductive layer 109 may be selectively formed over the gate metal layer 108, but not formed over the third dielectric layers 308 of the dielectric structures 303. Alternatively, the conductive layer 109 may be formed across the top surface of the third dielectric layer 308 of the dielectric structure 303. Subsequently, a cover layer 120 may be formed over the conductive layer 109. In some embodiments, a planarization process may be performed to remove excess material of the cover layer 120 and the neighboring ILD strips 422 and the etch stop layer 421, thus forming the top surface of the cover layer 120 which is substantially leveled (or coplanar) with top surfaces of the ILD strips 422 and the etch stop layer 421.

According to some embodiments, a manufacturing method of a semiconductor device includes forming a stack of first semiconductor layers and second semiconductor layers alternatively formed on top of one another, where a topmost layer of the stack is one of the second semiconductor layers; forming a patterned mask layer on the topmost layer of the stack; forming a trench in the stack based on the patterned mask layer to form a fin structure; forming a cladding layer extending along sidewalls of the fin structure; and removing the patterned mask layer and a portion of the cladding layer by performing a two-step etching process, wherein the portion of the cladding layer is removed to form cladding spacers having a concave top surface with a recess depth increasing from the sidewalls of the fin structure.

According to some alternative embodiments, a manufacturing method of a semiconductor device includes forming on a fin structure by using a patterned mask layer, where the fin structure includes semiconductor channel layers and semiconductor sacrificial layers alternatively disposed on top of one another, a topmost layer of the fin structure is one of the semiconductor channel layers, and the patterned mask layer is formed on the topmost layer; forming a cladding layer extending along sidewalls of the fin structure; performing a first etching process by a first etchant to partially removing the cladding layer and the patterned mask layer; and performing a second etching process by a second etchant to accessibly expose the topmost layer of the fin structure with cladding spacers extending along the sidewalls of the fin structure, where an etch rate of the first etchant for the cladding layer is greater than that of the second etchant for the cladding layer.

According to some alternative embodiments, a manufacturing method of a semiconductor device includes forming a fin structure on a semiconductor substrate by a patterned mask layer, where the fin structure includes semiconductor channel layers and semiconductor sacrificial layers alternately stacked; forming isolation structures along sidewalls of the semiconductor substrate; forming a cladding layer on the isolation structures and along sidewalls of the fin structure; forming dielectric structures on the isolation structures, where the dielectric structures are in contact with the cladding layer; removing a portion of the cladding layer and the patterned mask layer to accessibly expose a topmost one of the semiconductor channel layers of the fin structure, where the portion of the cladding layer is removed to form cladding spacers with concave top surfaces; and replacing the semiconductor sacrificial layers of the fin structure to form a gate structure wrapping around each of the semiconductor channel layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor device, comprising:
   forming a stack of first semiconductor layers and second semiconductor layers alternatively formed on top of one another, wherein a topmost layer of the stack is one of the second semiconductor layers;
   forming a patterned mask layer on the topmost layer of the stack;
   forming a trench in the stack based on the patterned mask layer to form a fin structure;
   forming a cladding layer extending along sidewalls of the fin structure; and
   removing the patterned mask layer and a portion of the cladding layer by performing a two-step etching process, wherein the portion of the cladding layer is removed to form cladding spacers having a concave top surface with a recess depth increasing from the sidewalls of the fin structure.

2. The manufacturing method of claim 1, wherein performing the two-step etching process comprises:
   applying a first wet etchant in a first etching step; and
   applying a second wet etchant different from the first wet etchant in a second etching step, wherein an etch rate of the first etchant for the cladding layer is higher than that of the second etchant for the cladding layer.

3. The manufacturing method of claim 2, wherein the second wet etchant comprises a higher selectivity to the topmost layer of the stack and a lower selectivity to the cladding layer.

4. The manufacturing method of claim 1, wherein the patterned mask layer has a first percentage of germanium, and the cladding layer has a second percentage of germanium, and the first percentage is higher than the second percentage.

5. The manufacturing method of claim 1, wherein performing the two-step etching process comprises:
   performing a first etching step by applying a first etchant to partially remove the cladding layer and the patterned mask layer, thereby causing top surfaces of the cladding layer and the patterned mask layer to have a concave cross-section; and
   performing a second etching step by applying a second etchant to remove a remaining portion of the patterned mask layer and the portion of the cladding layer, wherein the topmost layer of the stack remains substantially intact.

6. The manufacturing method of claim 1, further comprising:
   filling a lower portion of the trench with an isolation structure before forming the cladding layer; and
   forming a dielectric structure on the isolation structure in the trench before performing the two-step etching process.

7. The manufacturing method of claim 1, further comprising:
   replacing the first semiconductor layers of the fin structure to form a gate structure wrapping around each of the second semiconductor layers.

8. The manufacturing method of claim 7, wherein during the replacing, the cladding spacers and the first semiconductor layers are removed in a same step.

9. A manufacturing method of a semiconductor device, comprising:
   forming a fin structure by using a patterned mask layer, wherein the fin structure comprises semiconductor channel layers and semiconductor sacrificial layers alternatively disposed on top of one another, a topmost layer of the fin structure is one of the semiconductor channel layers, and the patterned mask layer is formed on the topmost layer;
   forming a cladding layer extending along sidewalls of the fin structure;
   performing a first etching process by a first etchant to partially removing the cladding layer and the patterned mask layer; and
   performing a second etching process by a second etchant to accessibly expose the topmost layer of the fin structure with cladding spacers extending along the sidewalls of the fin structure, wherein an etch rate of the first etchant for the cladding layer is greater than that of the second etchant for the cladding layer.

10. The manufacturing method of claim 9, wherein the patterned mask layer contains silicon germanium with a first percentage of germanium, and the cladding layer contains silicon germanium with a second percentage of germanium which is less than the first percentage.

11. The manufacturing method of claim 10, wherein when performing the first etching process, the patterned mask layer is removed faster than the cladding layer, thereby causing a top surface of the cladding layer to be higher than a top surface of the patterned mask layer.

12. The manufacturing method of claim 9, wherein after the first etching process, a portion of the patterned mask layer is remained on the topmost layer of the fin structure.

13. The manufacturing method of claim 12, wherein when performing the second etching process, the portion of the patterned mask layer is removed together with a portion of the cladding layer to form the cladding spacers having concave top surfaces.

14. The manufacturing method of claim 9, wherein the etch rate of the second etchant for the cladding layer is greater than an etch rate of the second etchant for the topmost layer of the fin structure.

15. The manufacturing method of claim 9, further comprising:
   forming isolation structures along sidewalls of a semiconductor substrate on which the fin structure is formed, before forming the cladding layer;
   forming dielectric structures on the isolation structures to be in contact with the cladding layer before performing the first etching process; and
   replacing the semiconductor sacrificial layers of the fin structure to form a gate structure wrapping around each of the semiconductor channel layers, wherein during the replacing, the cladding spacers are removed together with the semiconductor sacrificial layers.

16. A manufacturing method of a semiconductor device, comprising:
   forming a fin structure on a semiconductor substrate by a patterned mask layer, wherein the fin structure comprises semiconductor channel layers and semiconductor sacrificial layers alternately stacked;
   forming isolation structures along sidewalls of the semiconductor substrate;
   forming a cladding layer on the isolation structures and along sidewalls of the fin structure;
   forming dielectric structures on the isolation structures, wherein the dielectric structures are in contact with the cladding layer;
   removing a portion of the cladding layer and the patterned mask layer to accessibly expose a topmost one of the semiconductor channel layers of the fin structure, wherein the portion of the cladding layer is removed to form cladding spacers with concave top surfaces; and
   replacing the semiconductor sacrificial layers of the fin structure to form a gate structure wrapping around each of the semiconductor channel layers.

17. The manufacturing method of claim 16, wherein removing the portion of the cladding layer and the patterned mask layer comprises:
   applying a first wet etchant over the cladding layer and the patterned mask layer to form a concave top surface of the cladding layer and the patterned mask layer; and
   applying a second wet etchant over remaining portion of the patterned mask layer and the cladding layer to completely remove the patterned mask layer and form the cladding spacers.

18. The manufacturing method of claim 17, wherein the patterned mask layer contains silicon germanium with a first percentage of germanium, and the cladding layer contains silicon germanium with a second percentage of germanium which is less than the first percentage.

19. The manufacturing method of claim 16, wherein during replacing the semiconductor sacrificial layers, the cladding spacers are removed together with the semiconductor sacrificial layers.

20. The manufacturing method of claim 16, further comprising:
- forming a dummy gate structure over the fin structure after the removing;
- forming source/drain epitaxial structures coupled to the fin structure; and
- removing the dummy gate structure before the replacing.

\* \* \* \* \*